(12) United States Patent
Kim et al.

(10) Patent No.: US 10,867,690 B2
(45) Date of Patent: Dec. 15, 2020

(54) MEMORY MODULES AND METHODS OF OPERATING MEMORY SYSTEMS INCLUDING THE SAME

(71) Applicant: Samsung Electronics Co., Ltd., Suwon-si (KR)

(72) Inventors: Hyun-Joong Kim, Hwaseong-si (KR); Duk-Sung Kim, Hwaseong-si (KR); Yoo-Jung Lee, Hwaseong-si (KR); Jang-Seok Choi, Seongnam-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/392,849

(22) Filed: Apr. 24, 2019

(65) Prior Publication Data

US 2020/0135292 A1 Apr. 30, 2020

(30) Foreign Application Priority Data

Oct. 24, 2018 (KR) .................. 10-2018-0127094

(51) Int. Cl.
*G11C 11/10* (2006.01)
*G11C 29/42* (2006.01)
*G11C 29/00* (2006.01)
*G06F 11/10* (2006.01)

(52) U.S. Cl.
CPC .......... *G11C 29/42* (2013.01); *G06F 11/106* (2013.01); *G06F 11/1024* (2013.01); *G11C 29/783* (2013.01)

(58) Field of Classification Search
CPC ..... G11C 29/42; G11C 29/783; G06F 11/106; G06F 11/1024
See application file for complete search history.

(56) References Cited

U.S. PATENT DOCUMENTS

| | | | |
|---|---|---|---|
| 8,806,245 B2 | 8/2014 | Machnicki et al. | |
| 9,658,642 B2 | 5/2017 | Mozak | |
| 9,748,960 B2 | 8/2017 | Zerbe et al. | |
| 9,786,353 B2 | 10/2017 | Mansuri et al. | |
| 9,984,740 B1 | 5/2018 | Hiraishi | |
| 2014/0317470 A1* | 10/2014 | Chung | G06F 11/1076 714/764 |
| 2016/0099030 A1 | 4/2016 | Ko | |
| 2018/0152206 A1* | 5/2018 | Sin | G06F 11/1076 |
| 2019/0206477 A1* | 7/2019 | Kim | G11C 16/0483 |

* cited by examiner

*Primary Examiner* — Mohammed A Bashar
(74) *Attorney, Agent, or Firm* — Muir Patent Law, PLLC

(57) ABSTRACT

A memory module includes a first channel of first data memories and a first error correction code (ECC) memory, and a second channel of second data memories and a second ECC memory. Each first data memory transmits a corresponding first data set of first data sets with a memory controller. Each first data set corresponds to a burst length. Each second data memory transmits a corresponding second data set of the second data sets with the memory controller. Each second data set corresponds to the burst length. The first ECC memory stores first sub parity data for detecting at least one error in all of the first data sets stored in the first data memories. The second ECC memory stores second sub parity data for detecting at least one error in all of the second data sets stored in the second data memories.

18 Claims, 22 Drawing Sheets

MEMORY MODULES AND METHODS OF OPERATING MEMORY SYSTEMS INCLUDING THE SAME

CROSS-REFERENCE TO RELATED APPLICATION(S)

This application claims priority under 35 U.S.C. § 119 to Korean Patent Application No. 10-2018-0127094, filed on Oct. 24, 2018 in the Korean Intellectual Property Office, the disclosure of which is incorporated by reference herein in its entirety.

BACKGROUND

1. Technical Field

Example embodiments relate to memory devices, and more particularly to memory modules and methods of operating memory systems including the same.

2. Discussion of the Related Art

In general, a computer system may include a plurality of memory chips (e.g., DRAM) in a memory module for high performance and large volume. A memory module may be implemented by mounting a plurality of memory chips on a printed circuit board. The memory module may be a single in-line memory module (hereinafter, referred to as SIMM) and a dual in-line memory module (hereinafter, referred to as DIMM). The SIMM may include a plurality of memory chips mounted on one side of a printed circuit board, and the DIMM may include a plurality of memory chips mounted on both sides of the printed circuit board.

SUMMARY

According to an exemplary embodiment of the present inventive concept, a memory module includes first data memories and a first error correction code (ECC) memory that constitute a first channel, and second data memories and a second ECC memory that constitute a second channel. Each of the first data memories transmits a corresponding first data set of first data sets with a memory controller. Each of the first data sets corresponds to a burst length. Each of the second data memories transmits a corresponding second data set of the second data sets with the memory controller. Each of the second data sets corresponds to the burst length. The first ECC memory stores first sub parity data for detecting at least one error in all of the first data sets stored in the first data memories. The second ECC memory stores second sub parity data for detecting at least one error in all of the second data sets stored in the second data memories.

According to an exemplary embodiment of the present inventive concept, a memory module includes a first channel including first data memories, a second channel including second data memories, and an error correction code (ECC) memory. The first data memories and the second data memories store first data sets and second data sets respectively. Each of the first data sets corresponds to a burst length. Each of the second data sets corresponds to the burst length. The ECC memory stores parity data for detecting at least one error in at least one of a first sub user data set corresponding to all of the first data sets and a second sub user data set corresponding to all of the second data sets.

According to an exemplary embodiment of the present inventive concept, a method of operating a memory system is provided as follows. The memory system includes a memory module and a memory controller to control the memory module. The memory module includes first data memories, second data memories and an error correction code (ECC) memory. Each of first data sets corresponding to a burst length is stored in a corresponding first data memory of the first data memories. Each of second data sets corresponding to the burst length is stored in a corresponding second data memory of the second data memories. First sub parity data associated with all of the first data sets and second sub parity data associated with all of the second data sets are stored in the ECC memory. Whether each of the first data memories and the second data memories has an error bit is detected by the memory controller based on all of the first data sets and all of the second data sets. Whether the detected error bit is correctable is determined by the memory controller based on the first sub parity data and the second sub parity data. A data value of the detected error bit is flipped by the memory controller in response to determining that the detected error bit is not correctable.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF EXEMPLARY EMBODIMENTS

Various example embodiments will be described more fully hereinafter with reference to the accompanying drawings, in which some example embodiments are shown.

Figure 1:
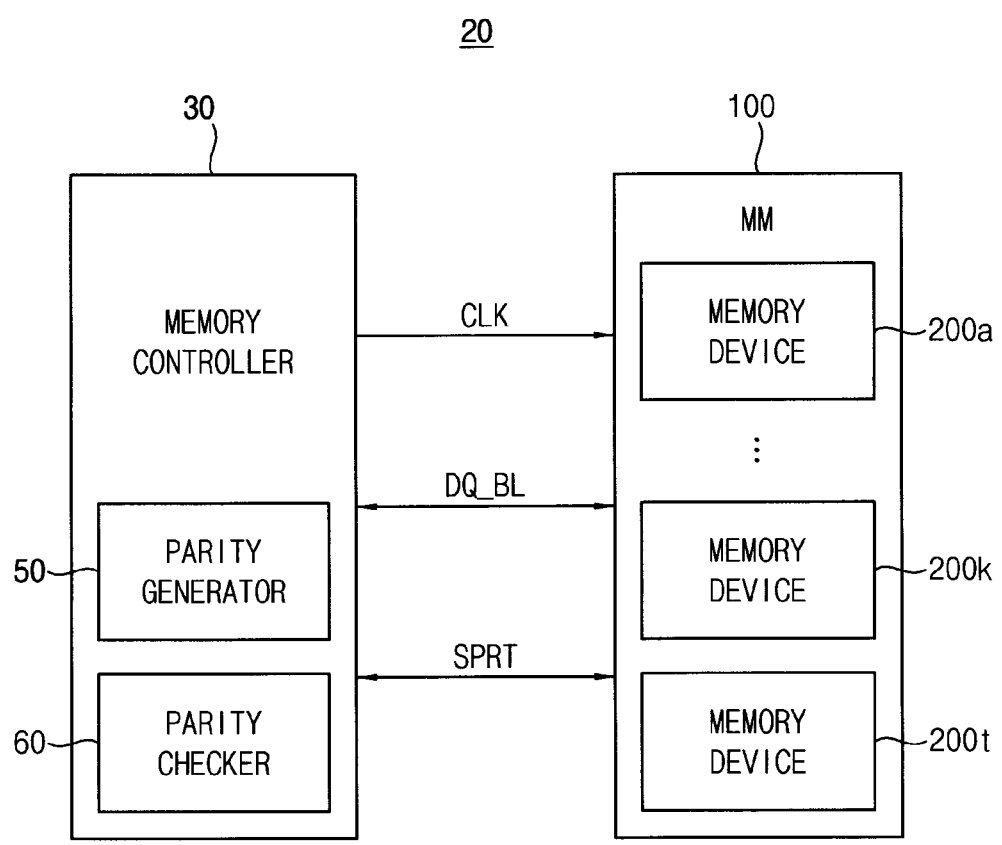
FIG. 1 is a block diagram illustrating a memory system according to example embodiments.

FIG. 1 is a block diagram illustrating a memory system according to example embodiments.

Referring to FIG. 1, a memory system 20 includes a memory controller 30 and a memory module 100. The memory module 100 includes a plurality of memory devices 200a~200k and 200t. The plurality of memory devices 200a~200k and 200t includes a plurality of data memories 200a~200k and at least one error correction code (ECC) memory 200t.

The memory controller 30 may control an overall operation of the memory system 20. The memory controller 30 may control an overall data exchange between a host and the plurality of memory devices 200a~200k and 200t. For example, the memory controller 30 may write data in the plurality of memory devices 200a~200k and 200t or read data from the plurality of memory devices 200a~200k and 200p in response to request from the host. In addition, the memory controller 30 may issue operation commands to the plurality of memory devices 200a~200k and 200t for controlling the plurality of memory devices 200a~200k and 200t.

In some embodiments, each of the plurality of memory devices 200a~200k and 200t may include dynamic memory cells such as a dynamic random access memory (DRAM).

In some embodiments, a number of the data memories 200a~200k may be 16 or 8, but is not limited thereto.

In example embodiments, each of the data memories 200a~200k may be referred to as a data chip and the ECC memory 200t may be referred to as parity memory or a redundant memory. In addition, the ECC memory 200t may be referred to as a parity chip or a redundant chip.

The memory controller 30 and the memory module 100 may exchange a data set DQ_BL and a parity data set SPRT in response to a clock signal CLK.

The data set DQ_BL includes a data set corresponding to a burst length, which is provided to/output from each of the data memories 200a~200k and the parity data set SPRT includes parity data associated with a user data set corresponding to all of the data sets DQ_BL of the data memories 200a~200k. For example, the data set DQ_BL may have an amount of data exchanged in a burst operation between the memory controller 30 and each of the data memories 200a~200k in the memory module 100. The size of the data set DQ_BL may be determined by an input/output (TO) width of each of the data memories 200a~200k times a size of the burst length of the burst operation. When each of the data memories 200a~200k may have ×4 IO widths, and the size of the burst length is 16, the size of the data set DQ_BL is 64 bits.

The memory controller 30 includes a parity generator 50 and a parity checker 60. The parity generator 50 generates the parity data set SPRT based on the user data set and the parity checker 60 detects at least one error bit in the user data set by a unit of a segment, using the parity data set SPRT.

Each of the data memories 200a~200k and the ECC memory 200t may perform a burst operation. Herein, the burst operation may mean an operation of writing or reading a predetermined size of data by sequentially increasing or decreasing an initial address provided from the memory controller 30. For example, the burst operation may include a plurality of data transfers that occur in a read or write burst operation. The number of the plurality of data transfers may be determined according to the burst length. For example, in a burst read or write operation with a burst length of 4, four consecutive read or write operations may be performed.

In example embodiments, the burst length may mean the number of operations of continuously reading or writing data by sequentially increasing or decreasing an initial address. For example, in the event that each of the data memories 200a~200k and the ECC memory 200t is a double data rate (DDR) dynamic random access memory (DRAM) and a burst length thereof is 16, it may perform a burst read or write operation in which a read or write operation is performed consecutively sixteen times by sequentially increasing or decreasing an initial address in response to the clock signal CLK.

Figure 2A:
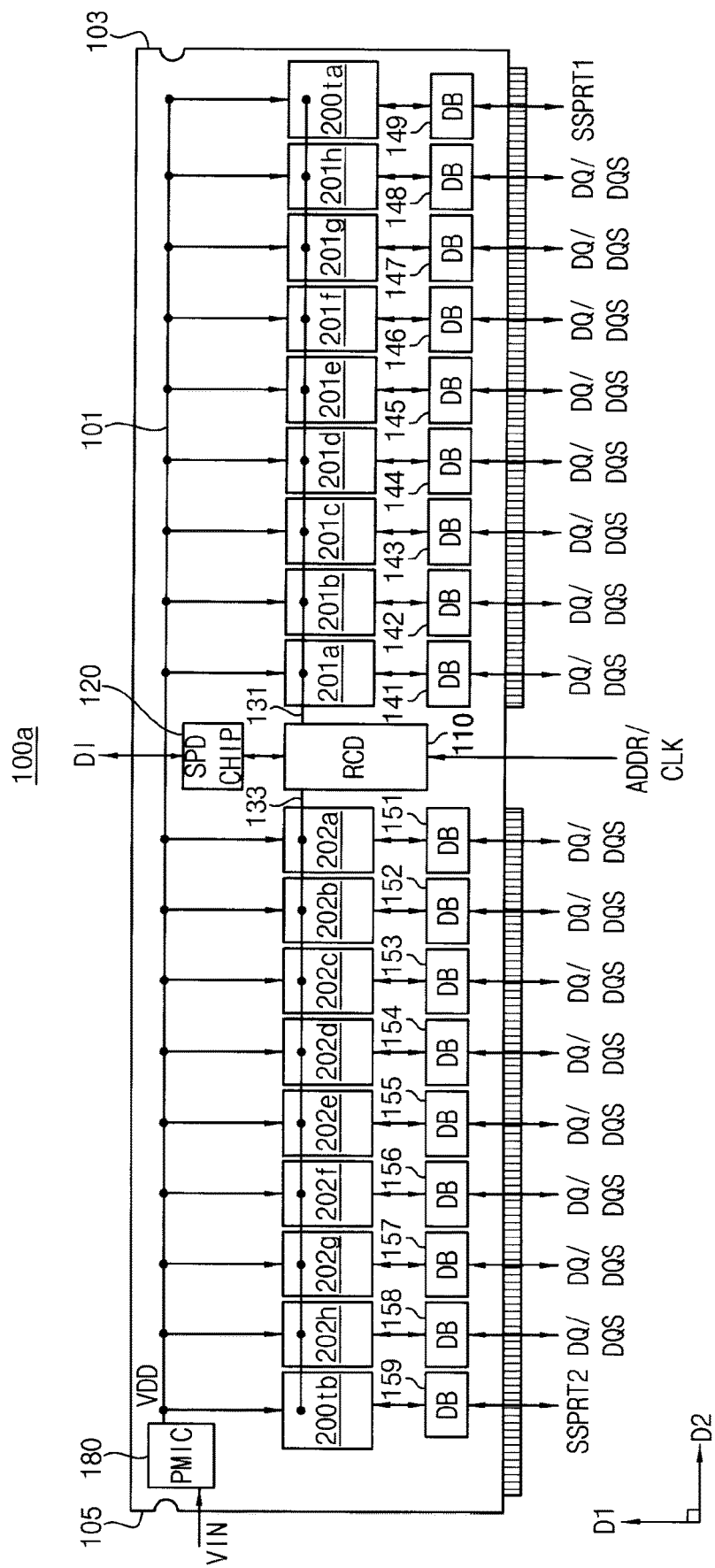
FIG. 2A is a block diagram illustrating an example of the memory module in FIG. 1 according to example embodiments.

FIG. 2A is a block diagram illustrating an example of the memory module in FIG. 1 according to example embodiments.

Referring to FIG. 2A, a memory module 100a includes a buffer device 110 disposed (or mounted) on a circuit board 101, a plurality of first data memories 201a~201h, a first ECC memory 200ta, a plurality of second data memories 202a~202h, a second ECC memory 200tb, a plurality of data buffers 141~149 and 151~159, a serial presence detect (SPD) chip 120 and a power management integrated circuit (PMIC) 180.

Hereinafter, the first data memories 201a~201h, the first ECC memory 200ta, the second data memories 202a~202h and the second ECC memory 200tb may be referred to as memory devices.

Here, the circuit board 101 which is a printed circuit board may extend to a second direction D2, perpendicular to a first direction D1, between a first edge portion 103 and a second edge portion 105.

The buffer device 110 may receive a command CMD, an address ADDR and the clock signal CLK from the memory controller 30 and redistribute the received signals to the memory devices.

In response to the redistributed signals by the buffer device 110, data received through a data signal DQ and a data strobe signal DQS may be written in the memory devices or data stored in the memory devices may be outputted through the data signal DQ and the data strobe signal DQS in response to the redistributed signal by the buffer device 110. For example, the buffer device 110 may transmit the address ADDR, the command CMD, and the clock signal CLK from the memory controller 30 to the memory devices.

For example, the memory devices may include a volatile memory device such as a dynamic random access memory (DRAM), a static random access memory (SRAM), and a synchronous DRAM (SDRAM). The memory devices may include a double data rate 5 (DDR5) SDRAM.

The SPD chip 120 may be a programmable read only memory (e.g., EEPROM). The SPD chip 120 may include initial information or device information DI of the memory module 100a. In example embodiments, the SPD chip 120 may include the initial information or the device information DI such as a module form, a module configuration, a storage capacity, a module type, an execution environment, and the like of the memory module 100a. For example, the SPD chip 120 may include information associated with a plurality of burst lengths supported by the memory devices.

When the memory system 20 including the memory module 100a is booted up, the memory controller 30 may read the device information DI from the SPD chip 120 and may recognize the memory module 100a based on the device information DI. The memory controller 30 may control the memory module 100a based on the device information DI from the SPD chip 120. For example, the memory controller 30 may recognize a type of the memory devices included in the memory module 100a based on the device information DI from the SPD chip 120.

The PMIC 180 receives an input voltage VIN, generates a power supply voltage VDD based on the input voltage VIN and provides the power supply voltage VDD to the memory devices. The memory devices operate based on the power supply voltage VDD.

The buffer device 110 may be disposed on a center of the circuit board 101. The first data memories 201a~201h and the first ECC memory 200ta may be arranged between the buffer device 110 and the first edge portion 103. The second data memories 202a~202h, and the second ECC memory 200tb may be arranged between the buffer device 110 and the second edge portion 105.

Each of the first data memories 201a~201h may be coupled to a corresponding one of the data buffers 141~148 through a data transmission line for receiving/transmitting the data signal DQ and the data strobe signal DQS. The first ECC memory 200ta may be coupled to the data buffer 149 for receiving/transmitting first sub parity data SSPRT1. Each of the second data memories 202a~202h may be coupled to a corresponding one of the data buffers 151~158 through a data transmission line for receiving/transmitting the data signal DQ and the data strobe signal DQS. The second ECC memory 200tb may be coupled to the data buffer 159 for receiving/transmitting second sub parity data SSPRT2.

The buffer device 110 may provide a command/address signal to the first data memories 201a~201h and the first ECC memory 200ta through a first command/address transmission line 131 and may provide a command/address signal to the second data memories 202a~202h and the second ECC memory 200tb through a second command/address transmission line 133.

The SPD chip 120 is disposed to be adjacent to the buffer device 110 and the PMIC 180 is disposed between the second ECC memory 200tb and the second edge portion 105.

Figure 2B:
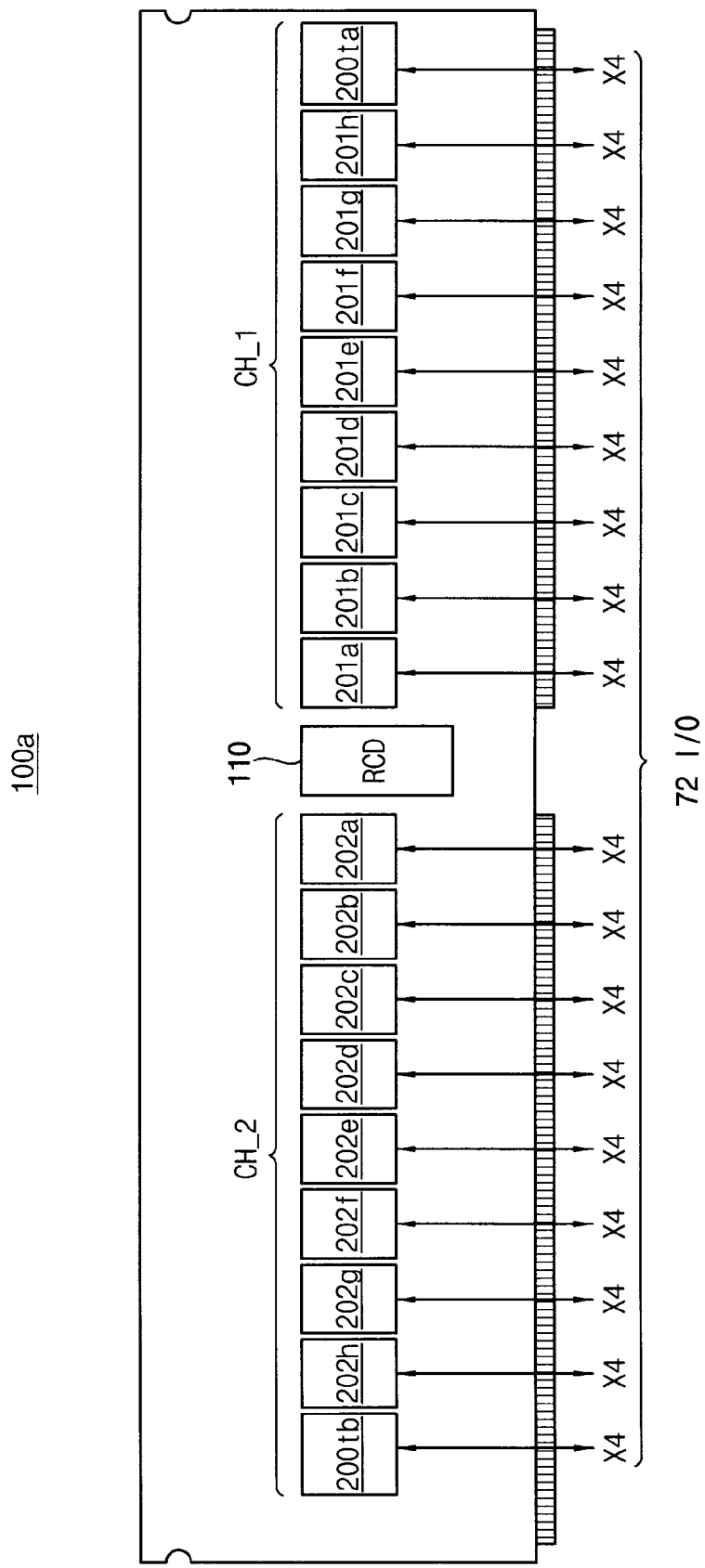
FIG. 2B illustrates a data input/output (I/O) width of the memory module of FIG. 2A.

FIG. 2B illustrates data input/output (I/O) width of the memory module of FIG. 2A.

Referring to FIG. 2B, the first data memories 201a~201h and the first ECC memory 200ta may constitute a first channel CH_1 of the memory module 100a and the second data memories 202a~202h and the second ECC memory 200tb may constitute a second channel CH_2 of the memory module 100a. Each of first data memories 201a~201h and each the second data memories 201a~201h has a 4-bit data input/output width. In a burst operation, each of first data memories 201a~201h and the second data memories 201a~201h stores/outputs a data amount corresponding to 4-bit data times a burst length. Each of the first ECC memory 200ta and the second ECC memory 200tb has a 4-bit data input/output width. In a burst operation, each of the first ECC memory 200ta and the second ECC memory 200tb stores/outputs a data amount corresponding to a 4-bit parity bits times the burst length. Therefore, the memory module 100a (i.e., the first channel CH_1 and the second channel CH_2) may have a 72-bit data I/O width. For example, the first channel CH_1 has a 36-bit data input/output width and the second channel CH_2 has a 36-bit data input/output width. The first channel CH_1 and the second channel CH_2 operate independently from each other in inputting/outputting data. That is, the data input/output of the first channel CH1 is not affected by the second channel CH_2 and the data input/output of the second channel CH2 is not affected by the first channel CH_1.

In FIG. 2B, each of the first data memories 201a~201h, the second data memories 201a~201h, the first ECC memory 200ta and the second ECC memory 200tb may be DDR4 SDRAM or DDR5 SDRAM.

Figure 3A:
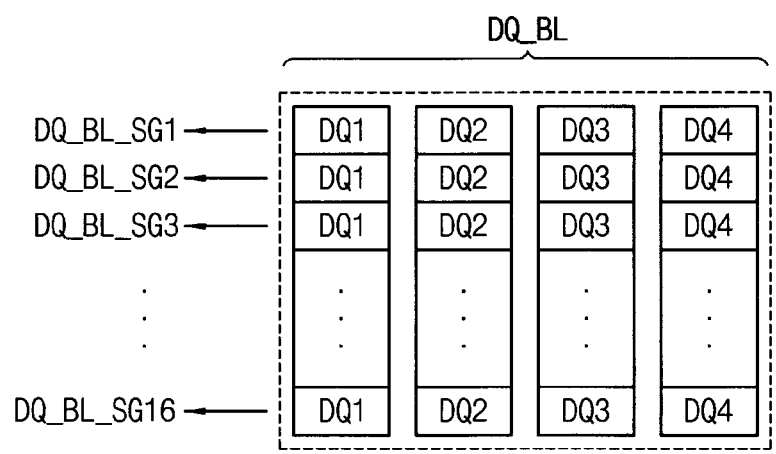
FIG. 3A illustrates a data set corresponding to a burst length in the memory module of FIG. 2A according to example embodiments.

FIG. 3A illustrates a data set corresponding to a burst length in the memory module of FIG. 2A according to example embodiments.

Referring to FIG. 3A, the data set DQ_BL corresponding to a burst length are input to/output from each of the first data memories 201a~201h and the second data memories 202a~202h. For example, the data set DQ_BL may be stored in or outputted from each of the first data memories 201a~201h and the second data memories 202a~202h in a burst operation. The data set DQ_BL includes a plurality of data segments DQ_BL_SG1~DQ_BL_SG16 each of which corresponding to one of a plurality of read or write operations that are performed in a burst operation. In each of the plurality of read or write operations, each of the first data memories 201a~201h and the second data memories 202a~202h may receive or output an amount of data corresponding to a data input/output width thereof. The burst length is assumed to be 16 in FIG. 3A. The data set DQ_BL corresponding to the burst length may be stored in a first cell region of each of the first data memories 201a~201h and the second data memories 202a~202h. The first cell region will be described in detail with reference to FIG. 11, for example.

Figure 3B:
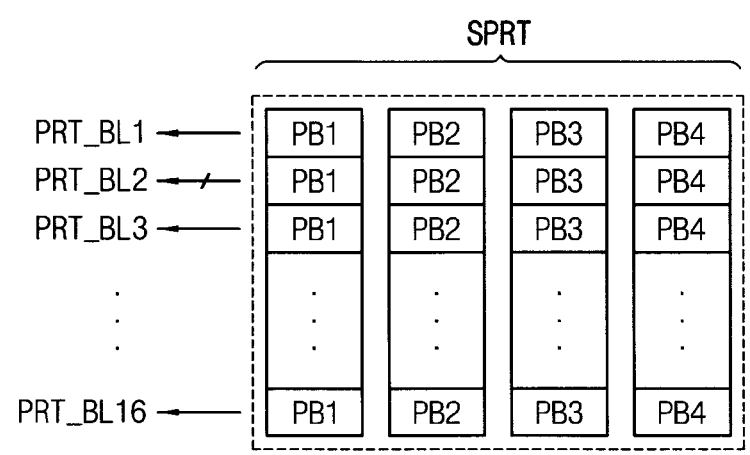
FIG. 3B illustrates a parity data set corresponding to a burst length, which is provided to/output from the first ECC memory and the second ECC memory in the memory module of FIG. 2A.

FIG. 3B illustrates a parity data set corresponding to the burst length, which is provided to/output from the first ECC memory 200ta and the second ECC memory 200tb in the memory module of FIG. 2A.

Referring to FIG. 3B, the parity data set SPRT includes a plurality of parity bits PRT_BL1~BRT_BL16 corresponding to the burst length. The parity data set SPRT is input to/output from each of the first ECC memory 200ta and the second ECC memory 200tb when a burst operation is performed on each of the first ECC memory 200ta and the second ECC memory 200tb according to the burst length. The burst length is assumed to be 16 in FIG. 3B, but example embodiments are not limited thereto. Each of the parity bits PRT_BL1~BRT_BL16 corresponding to single data transfer under the burst operation according to the burst length may be generated based on a corresponding data segment of the data segments DQ_BL_SG1~DQ_BL_SG16 to be stored in each of the first data memories 201a~201h and the second data memories 202a~202h.

Figure 4:
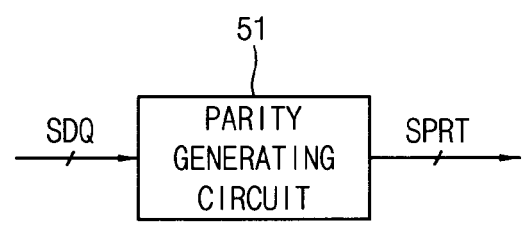
FIG. 4 is a block diagram illustrating a parity generator in the memory controller in FIG. 1 according to example embodiments.

FIG. 4 is a block diagram illustrating a parity generator in the memory controller in FIG. 1 according to example embodiments.

Referring to FIG. 4, the parity generator 50 includes a parity generating circuit 51.

The parity generating circuit 51 receives a user data set SDQ, and generates the parity data set SPRT based on the user data set SDQ. The parity generating circuit 51 may be implemented with an ECC encoder. The parity data set SPRT may be stored in a write buffer (not illustrated). The parity data set SPRT may be provided to the memory module 100 along with the user data set SDQ.

Figure 5:
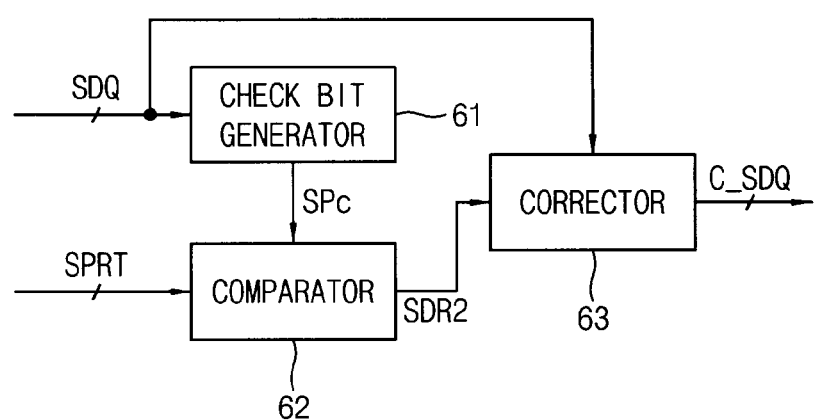
FIG. 5 is a block diagram illustrating a parity checker in the memory controller in FIG. 1 according to example embodiments.

FIG. 5 is a block diagram illustrating a parity checker in the memory controller in FIG. 1 according to example embodiments.

Referring to FIG. 5, the parity checker 60 includes a check bit generator 61, a comparator 62 and a data corrector 63.

The check bit generator 61 receives the user data set SDQ and generates a check bit set SPc based on the user data set SDQ. The comparator 62 compares corresponding bits of the parity data set SPRT (e.g. corresponding parity bits of the parity bits PRT_BL1~BRT_BL16) and the parity bit set SPc generated from the user data set SDQ and generates a syndrome data SDR2 indicating whether an error bit occurs and a position of the error bit. For example, the corresponding bits of the parity data set SPRT and the user data set SDQ are positioned in the same sequence of a burst operation or in the same segment of the burst operation. The data corrector 63 receives the user data set SDQ, inverts data of the user data set SDQ in which the error bit occurs, based on the syndrome data SDR2 and corrects the error bit in the user data set SDQ. The parity checker 60 may be implemented by ECC decoder and may perform an ECC decoding on the user data set SDQ by a unit of a segment of a burst operation, using a single error correction and double error detection (SECDED) code.

Figure 6:
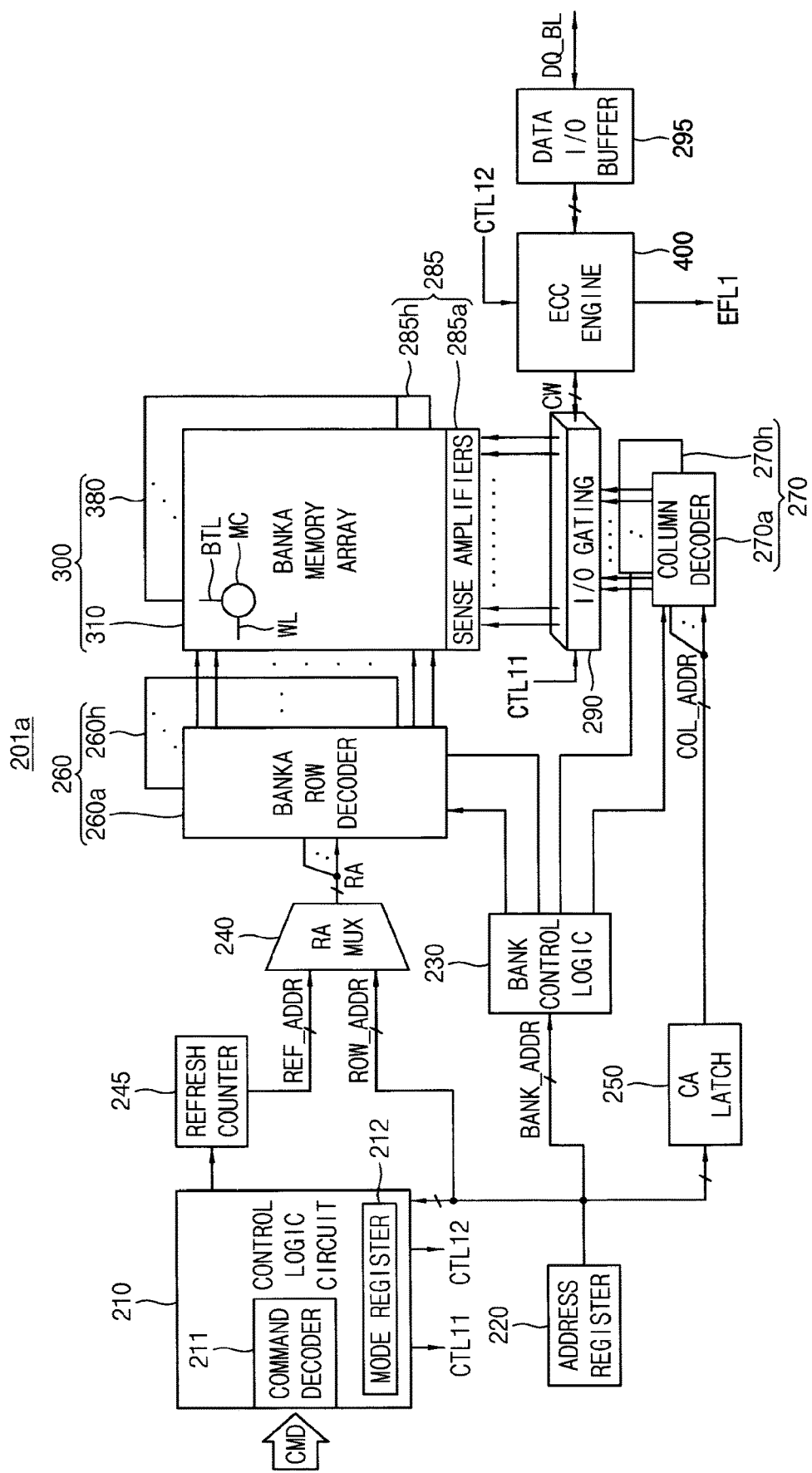
FIG. 6 is a block diagram illustrating one of the first data memories and the second data memories in the memory module of FIG. 2A according to example embodiments.

FIG. 6 is a block diagram illustrating one of the first data memories and the second data memories in the memory module of FIG. 2A according to example embodiments.

Although a configuration of the data memory 201a is illustrated in FIG. 5, a configuration of each of other data memories 201b-201h and 202a~202h and ECC memories 200ta and 200tb is substantially the same as the configuration of the data memory 201a.

Referring to FIG. 6, the data memory 201a includes a control logic circuit 210, an address register 220, a bank control logic 230, a row address multiplexer 240, a column address latch 250, a row address decoder 260, a column address decoder 270, a memory cell array 300, a sense amplifier unit 285, an input/output (I/O) gating circuit 290, a data input/output (I/O) buffer 295, a refresh counter 245 and an ECC engine 400.

The memory cell array 300 includes first through eighth bank arrays 310~380. The row address decoder 260 includes first through eighth bank row address decoders 260a~260h respectively coupled to the first through eighth bank arrays 310~380, the column address decoder 270 includes first through eighth bank column address decoders 270a~270h respectively coupled to the first through eighth bank arrays 310~380, and the sense amplifier unit 285 includes first through eighth bank sense amplifiers 285a~285h respectively coupled to the first through eighth bank arrays 310~380. The first through eighth bank arrays 310~380, the first through eighth bank row address decoders 260a~260h, the first through eighth bank column address decoders 270a~270h and first through eighth bank sense amplifiers 285a~285h may form first through eighth banks. Each of the first through eighth bank arrays 310~380 includes a plurality of memory cells MC coupled to word-lines WL and bit-lines BTL.

The address register 220 receives an address ADDR including a bank address BANK_ADDR, a row address ROW_ADDR and a column address COL_ADDR from the memory controller 30. The present inventive concept is not limited thereto. For example, the address register 220 may receive the command CMD from the memory controller 30.

The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals from the bank address BANK_ADDR. One of the first through eighth bank row address decoders 260a~260h corresponding to the bank address BANK_ADDR may be activated in response to the bank control signals, and one of the first through eighth bank column address decoders 270a~270h corresponding to the bank address BANK_ADDR may be activated in response to the bank control signals.

The row address multiplexer 240 may receive the row address ROW_ADDR from the address register 220, and may receive a refresh row address REF ADDR from the refresh counter 245. The row address multiplexer 240 may selectively output one of the row address ROW_ADDR and the refresh row address REF ADDR as a row address RA. The row address RA that is output from the row address multiplexer 240 may be applied to the first through eighth bank row address decoders 260a~260h.

The activated one of the first through eighth bank row address decoders 260a~260h may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In some embodiments, in a burst operation mode, the column address latch 250 may generate column addresses that are increased or decreased from the received column address COL_ADDR. The column address latch 250 may apply the temporarily stored or generated column address to the first through eighth bank column address decoders 270a~270h.

The activated one of the first through eighth bank column address decoders 270a~270h may decode the column address COL_ADDR that is output from the column address latch 250, and may control the input/output gating circuit 290 to output data corresponding to the column address COL_ADDR or the mapped column address MCA.

The I/O gating circuit 290 may include a circuitry for gating input/output data. The I/O gating circuit 290 may further include read data latches for storing data that is output from the first through eighth bank arrays 310~380, and write drivers for writing data to the first through eighth bank arrays 310~380.

A codeword CW to be read from one bank array of the first through eighth bank arrays 310~380 may be sensed by a sense amplifier coupled to the one bank array from which the data is to be read, and may be stored in the read data latches. The codeword CW is a unit of data on which an ECC operation is performed in the data memory 201a. In an exemplary embodiment, the ECC operation may be performed to correct a single bit error occurred in the memory cell array 300. For example, when the data memory 201a receives a p-bits per a write operation and q parity bits are added to the m bits of the data, the codeword CW has (p+q) bits. In an exemplary embodiment, the number of q parity bits may be one. The codeword CW stored in the read data latches is ECC-decoded by the ECC engine 400 and may be provided to the memory controller 30 via the data I/O buffer 295.

A data set DQ_BL to be written in one bank array of the first through eighth bank arrays 310~380 may be provided to the data I/O buffer 295 from the memory controller 30. The data set DQ_BL are provided to the ECC engine 400. The ECC engine 400 performs an ECC encoding operation on the data DQ_BL to generate first parity bits PRT and provides the I/O gating circuit 290 with a codeword CW including the data set DQ_BL and the first parity bits PRT. For example, the ECC encoding operation may be performed on each of the data segments DQ_BL_SG1~DQ_BL_SG16 by adding a parity bit thereto, and thus may generate sixteen codewords in a burst operation with a burst length of 16. The I/O gating circuit 290 may write the data DQ_BL and the parity bits in a normal cell region (a first memory region) and a redundancy cell region (a second memory region), respectively, in the one bank array, through the write drivers.

When the ECC engine 400 performs the ECC encoding operation and the ECC decoding, the ECC engine 400 may use an ECC which is represented by a generation matrix. When the data DQ_BL includes uncorrectable errors based on a result of the ECC decoding, the ECC engine 400 provides the first ECC memory 200ta with an error flag signal EFL1 indicating the data DQ_BL includes uncorrectable errors.

The control logic circuit 210 may control operations of the data memory 201a. For example, the control logic circuit 210 may generate control signals for the data memory 201a to perform a write operation or a read operation. The control logic circuit 210 may include a command decoder 211 that decodes a command CMD received from the memory controller 30 and a mode register 212 that sets an operation mode of the data memory 201a.

For example, the command decoder 211 may generate the control signals corresponding to the command CMD by decoding a write enable signal, a row address strobe signal, a column address strobe signal, a chip select signal, etc. The control logic circuit 210 may generate a first control signal CTL11 to control the I/O gating circuit 290 and a second control signal CTL12 to control the ECC engine 400.

Figure 7:
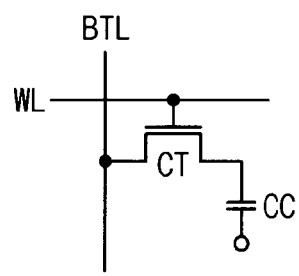
FIG. 7 is circuit diagrams of example implementations of the memory cell shown in FIG. 6.

FIG. 7 is circuit diagrams of example implementations of the memory cell shown in FIG. 6.

Referring to FIG. 7, a memory cell MC includes a cell capacitor CC and a transistor CT. The transistor CT may be a selection element (or switching element) that connects/disconnects the cell capacitor CC to/from bit-line BTL according to a voltage of a word-line WL. The transistor CT may be coupled between the cell capacitor CC, a word-line WL and a bit-line BTL, and the cell capacitor CC may be coupled between the transistor CT and a plate voltage (not illustrated).

Figure 8:
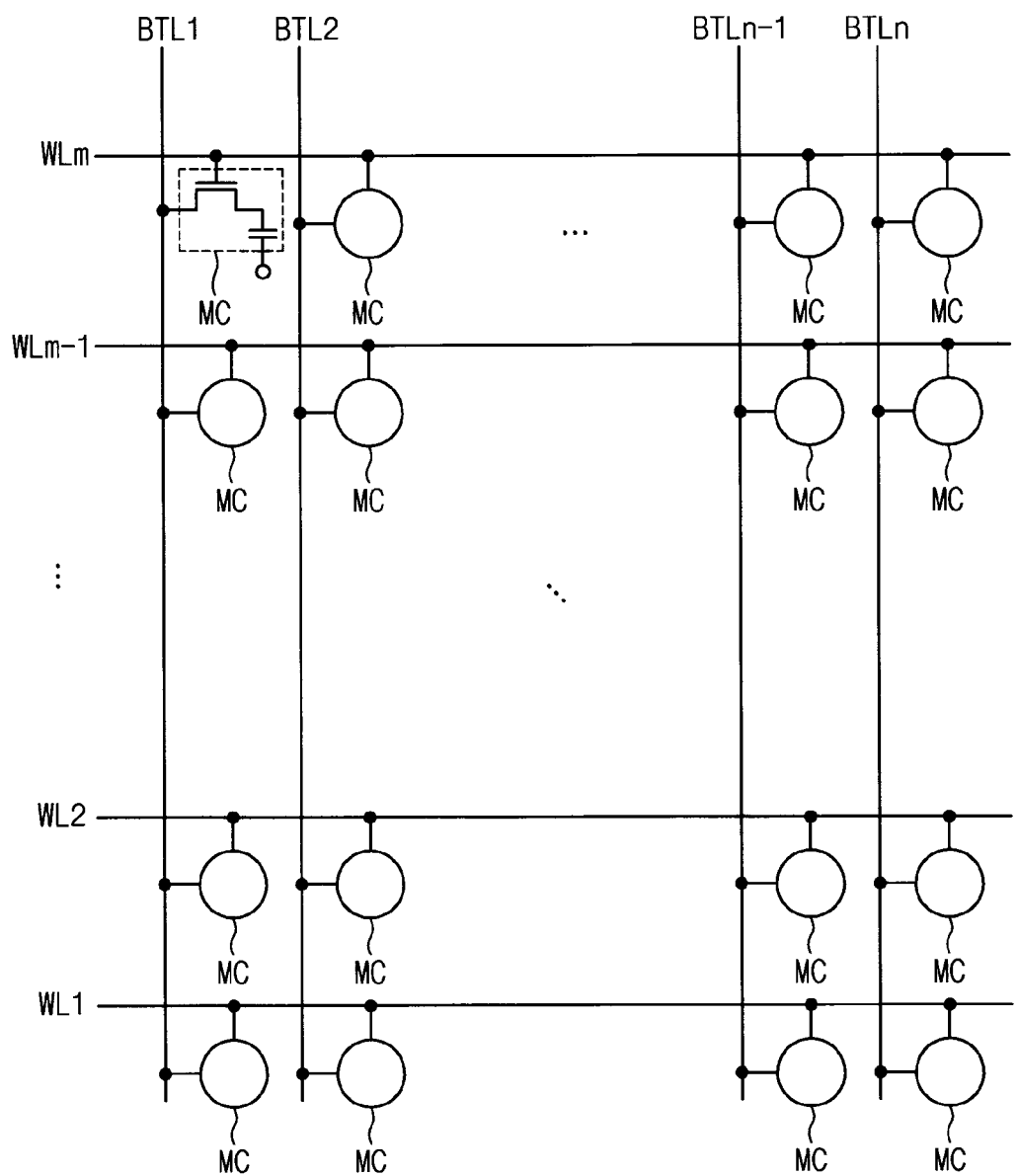
FIG. 8 illustrates an example of a first bank array in the data memory of FIG. 6.

FIG. 8 illustrates an example of the first bank array in the data memory of FIG. 6.

Referring to FIG. 8, the first bank array 310 a plurality of word-lines WL1~WLm (m is a natural number greater than two), a plurality of bit-lines BTL1~BTLn (n is a natural number greater than two), and a plurality of memory cells MCs disposed near intersections between the word-lines WL1~WLm and the bit-lines BTL1~BLTn. In one embodiment, each of the plurality of memory cells MCs may include a dynamic random access memory (DRAM) cell structure. The plurality of word-lines WL1~WLm to which the plurality of memory cells MCs are connected may be defined as rows of the first bank array 310 and the plurality of bit-lines BTL1~BTLn to which the plurality of memory cells MCs are connected may be defined as columns of the first bank array 310.

Figure 9:
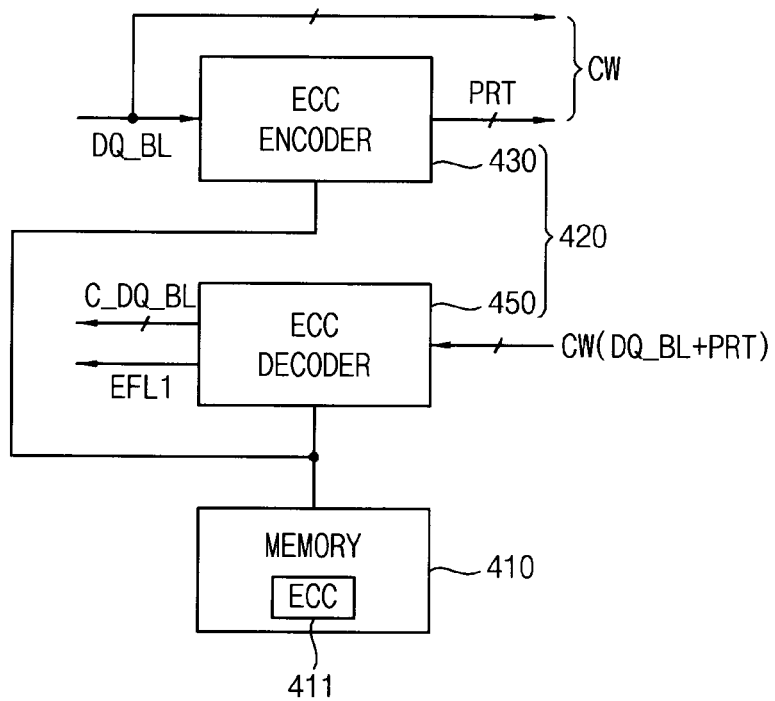
FIG. 9 is a block diagram illustrating an ECC engine in the data memory of FIG. 6 according to example embodiments.

FIG. 9 is a block diagram illustrating the ECC engine in the data memory of FIG. 6 according to example embodiments.

Referring to FIG. 9, the ECC engine 400 includes a memory 410, an ECC encoder 430 and an ECC decoder 450.

The memory 410 stores an ECC 411 represented by the generation matrix and may include a plurality of column vectors corresponding to data bits in the data set DQ_BL. For example, each of the column vectors may correspond to a corresponding one of the data segments DQ_BL_SG1~DQ_BL_SG16 of the data set DQ_BL.

The ECC encoder 430 is coupled to the memory 410, and may perform an ECC encoding operation on the data set DQ_BL using the ECC 411 to generate first parity bits PRT in a write operation of the data memory 201a. The ECC encoder 430 may provide the I/O gating circuit 290 with the codeword CW generated from the data set DQ_BL and the first parity bits PRT. For example, when the write operation is performed with a burst length of 16, the ECC encoder 430 may perform an encoding operation on each transfer (or each segment) of the burst operation so that sixteen codewords may be generated and stored in the data memory 201a through the I/O gating circuit 290.

The ECC decoder 450 is coupled to the memory 410, may receive the codeword CW generated from the data set DQ_BL and the first parity bits PRT in a read operation of the data memory 201a, may perform an ECC decoding operation on the data set DQ_BL based on the first parity bits PRT, using the ECC, to correct an error bit in the data set DQ_BL and may output a corrected data set C_DQ_BL. In addition, the ECC decoder 450 provides the first ECC memory 200ta with an error flag signal EFL1 indicating that the data set DQ_BL includes uncorrectable errors. For example, the ECC decoder 450 may provide the error flag signal EFL1 to the buffer device 110 and the buffer device 110 may redistribute the error flag signal EFL1 to the first ECC memory 200ta. In an exemplary embodiment, when a codeword has a single bit error, the ECC engine 400 may correct the error. When a codeword has two bit errors, one of the two bits may be uncorrected. In this case, the ECC decoder 450 may generate the error flag signal EFL1.

Although it is described that the memory 410 is coupled to the ECC encoder 430 and the ECC decoder 450, the ECC 411 stored in the memory 410 may be implemented with exclusive OR gates within the ECC encoder 430 and the ECC decoder 450.

Figure 10:
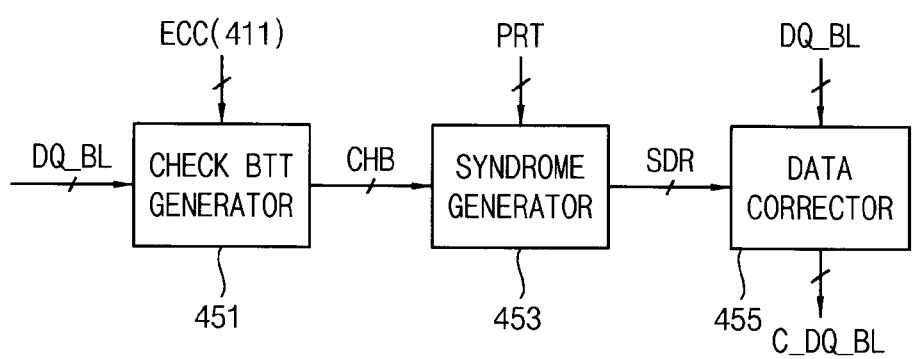
FIG. 10 is a block diagram illustrating an ECC decoder in the ECC engine of FIG. 9 according to example embodiments.

FIG. 10 is a block diagram illustrating the ECC decoder in the ECC engine of FIG. 9 according to example embodiments.

Referring to FIG. 10, the ECC decoder 450 includes a check bit generator 451, a syndrome generator 453 and a data corrector 455.

The check bit generator 451 generates check bits CHB based on the data bits in the data set DQ_BL, using the ECC 411. The syndrome generator 453 generates a syndrome data SDR indicating an occurrence of an error bit and a position of the error bit based on a comparison of the check bits CHB and first parity bits PRT.

The data corrector 455 receives the data set DQ_BL and the syndrome data SDR, corrects the error bit in the data set DQ_BL based on the syndrome data SDR and outputs the corrected data set C_DQ_BL.

In FIGS. 9 and 10, the ECC 411 may be a single error correction (SEC) code. In an exemplary embodiment, the ECC 411 may be a single error correction and double error detecting (SECDED) code. With the SECDED code, when a single bit error is detected, the error may be corrected, and when two bit errors are detected, one bit in error may be corrected with the remaining error bit uncorrected.

Figure 11:
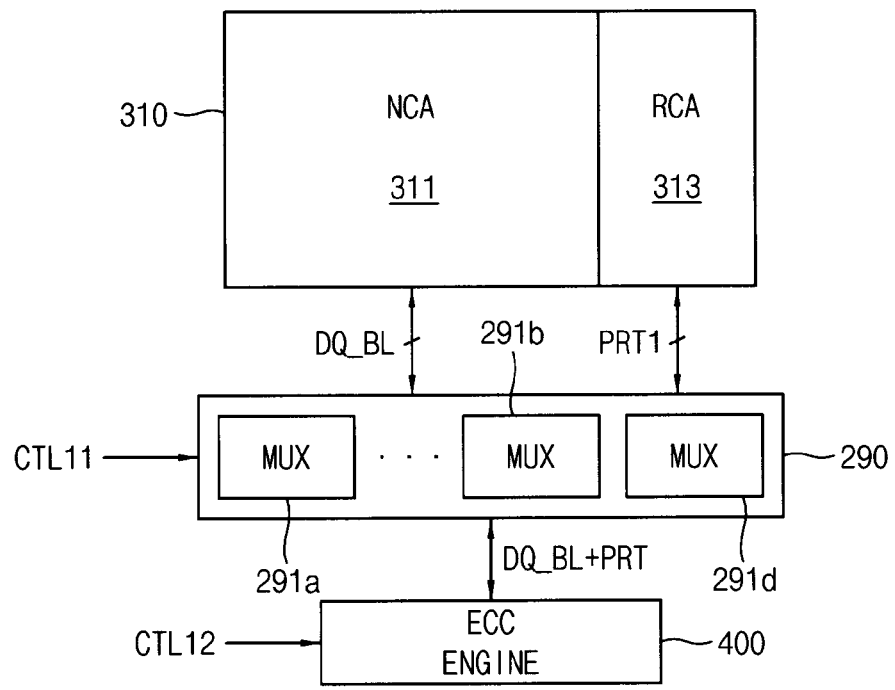
FIG. 11 illustrates a first bank array, an I/O gating circuit and an ECC engine in the data memory of FIG. 6.

FIG. 11 illustrates the first bank array, the I/O gating circuit and the ECC engine in the data memory of FIG. 6.

Referring to FIG. 11, the first bank array 310 of the data memory 201a includes a normal cell region (a first memory region) (NCA) 311 and a redundancy cell region (a second memory region) (RCA) 313.

The I/O gating circuit 290 includes a plurality of switches 291a, 291b and 291d. The switches 291a and 291b are connected to the normal cell region 311 and the switch 291d is connected to the redundancy cell region 313. The I/O gating circuit 290 receives the data set DQ_BL and the first parity bits PRT associated with the data set DQ_BL from the ECC engine 400, stores the data set DQ_BL in the normal cell region 311 and stores the first parity bits PRT in the redundancy cell region 313. For example, the ECC engine may generate the first parity bits PRT from the data set DQ_BL as described with reference to FIGS. 6 to 10.

The I/O gating circuit 290 performs the above-described operation based on the first control signal CTL11 from the control logic circuit 210 and the ECC engine 400 performs the ECC encoding operation and the ECC decoding operation based on the second control signal CTL12 from the control logic circuit 210.

Figure 12:
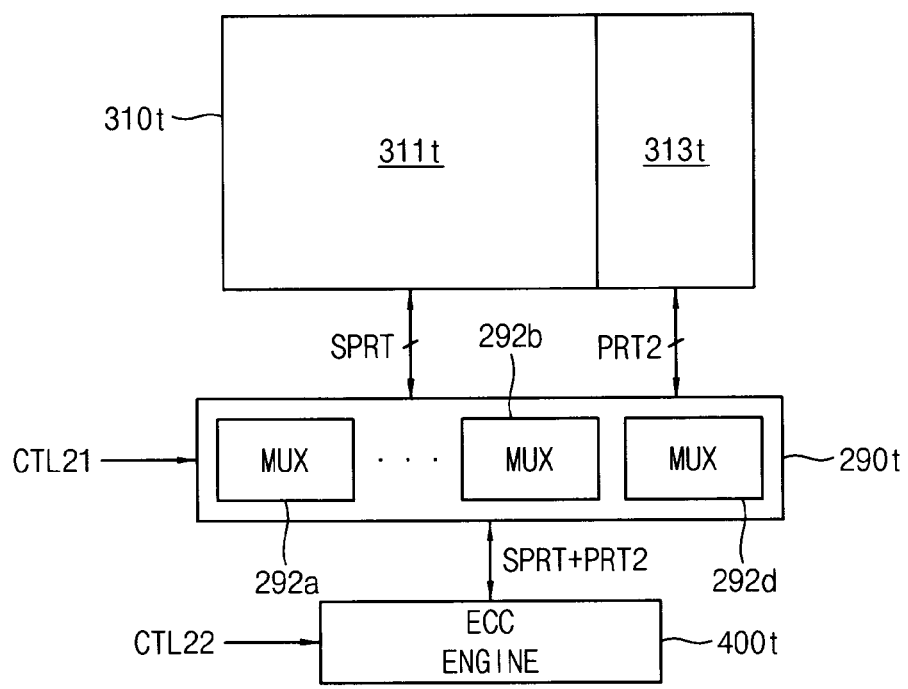
FIG. 12 illustrates a first bank array, an I/O gating circuit and an ECC engine in the first ECC memory in the memory module in FIG. 2A.

FIG. 12 illustrates a first bank array, an I/O gating circuit and an ECC engine in the first ECC memory in the memory module in FIG. 2A.

Referring to FIG. 12, a first bank array 310t of the first ECC memory 200ta includes a first parity region 311t and a second parity region 313t.

An I/O gating circuit 290t includes a plurality of switches 292a, 292b and 292d. The switches 292a and 292b are connected to the first parity region 311t and the switch 292d is connected to the second parity region 313t. The I/O gating circuit 290t receives the parity data set SPRT and internal parity bits PRT2 associated with the parity data set SPRT from an ECC engine 400t in the first ECC memory 200ta, stores the parity data set SPRT in the first parity region 311t and stores the internal parity bits PRT2 in the second parity region 313t. For example, an ECC engine 400t may generate the internal parity bits PRT2 from the parity data set SPRT as described with reference to FIGS. 6 to 10.

The I/O gating circuit 290t performs the above-described operation based on a first control signal CTL21 from a control logic circuit in the first ECC memory 200ta and the ECC engine 400t performs the ECC encoding operation and the ECC decoding operation based on a second control signal CTL22 from the control logic circuit.

Figure 13:
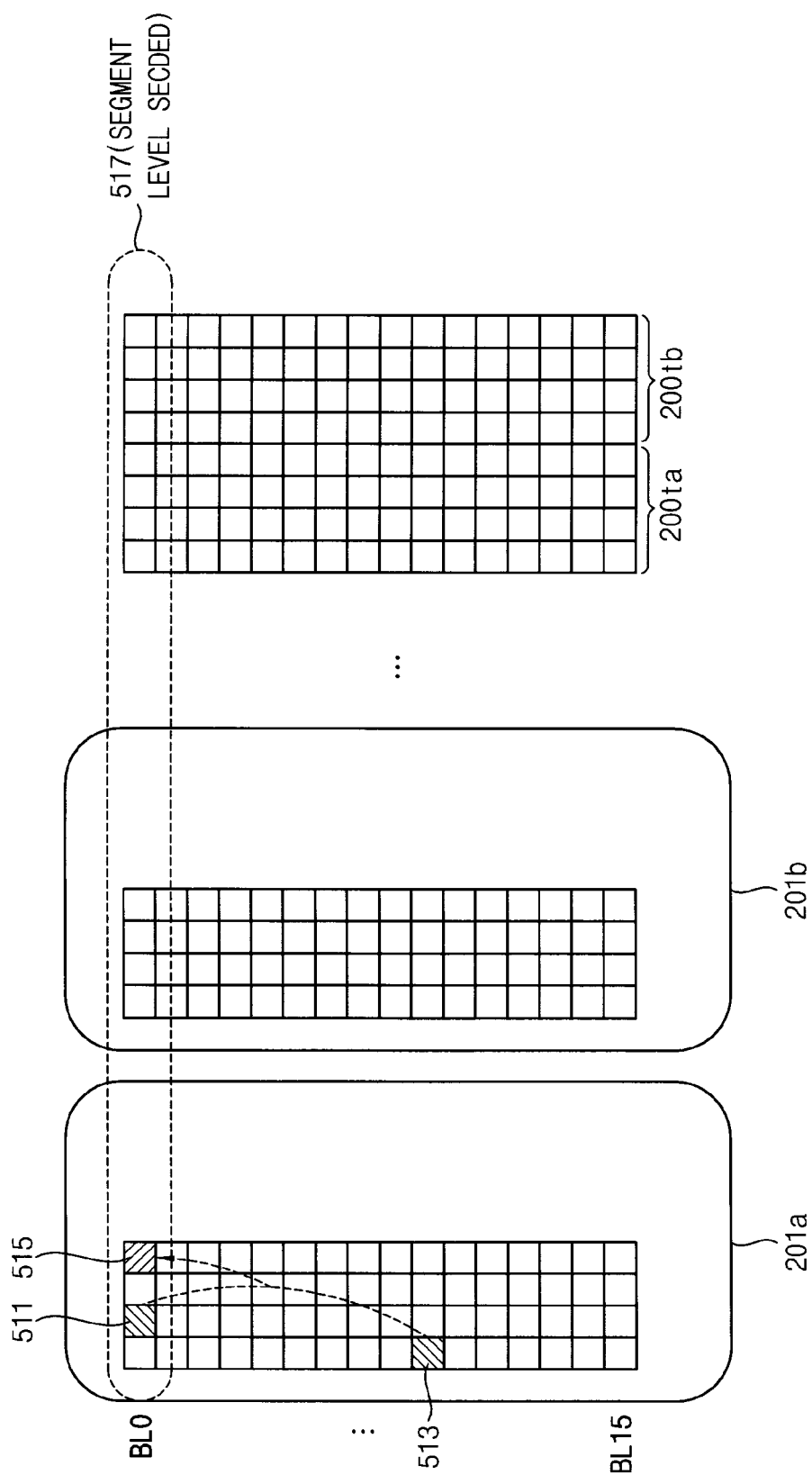
FIG. 13 illustrates that an error correction operation is performed by a unit of rank in the memory module of FIG. 2A.

FIG. 13 illustrates that error correction operation is performed by unit of rank in the memory module of FIG. 2A.

Referring to FIG. 13, the first data memories 201a~201h and the second data memories 202a~202h may store 64-bit data bits in each segment of a burst read operation. Each of the first ECC memory 200ta and the second ECC memory 200tb may store 4-bit parity data in each segment of a burst operation. In each segment of the burst operation performed on the first ECC memory 200ta and the second ECC memory 200tb, 4-bit parity data may be stored with respect to the data bits stored in the first data memories 201a~201h and the second data memories 201a~202h in the same segment of the burst operation performed on the first data memories 201a~201h and the second data memories 202a~202h. Therefore, each of the first ECC memory 200ta and the second ECC memory 200tb stores 64-bit parity data for all segments (e.g., 16 segments).

For example, when the data memory 201a includes a first error bit 511 and an uncorrected bit 515 due to the first error bit 511 in a first segment (or a first data transfer) BL0 of a burst operation and a second error bit 513 in a tenth segment (or a tenth data transfer) BL9, a segment level half-codeword 517 includes the first error bit 511 and the uncorrected bit 515. The memory controller 30 may detect error bits of the segment level half-codeword 517 because the parity checker 60 performs an ECC decoding on the user data set SDQ by a unit of a segment, using an SECDED code as described with reference to FIG. 5.

Figure 14A:
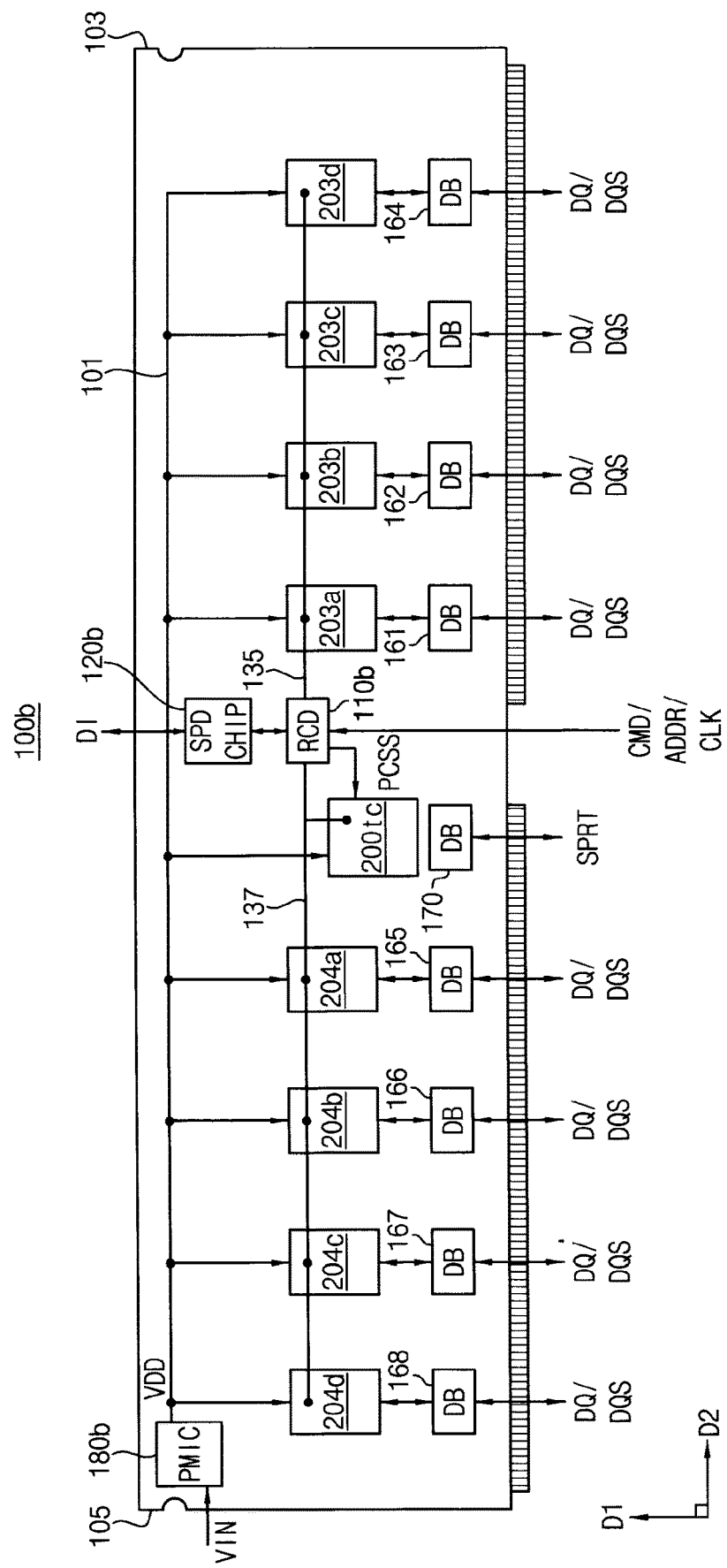
FIG. 14A is a block diagram illustrating another example of the memory module in FIG. 1 according to example embodiments.

FIG. 14A is a block diagram illustrating another example of the memory module in FIG. 1 according to example embodiments.

Referring to FIG. 14A, a memory module 100b includes a buffer device 110b disposed (or mounted) on a circuit board 101, a plurality of first data memories 203a~203d, a plurality of second data memories 204a~204d, an ECC memory 200tc, a plurality of data buffers 161~168 and 170, an SPD chip 120b and a PMIC 180b.

Hereinafter, the first data memories 203a~203d, the second data memories 204a~204d and the ECC memory 200tc may be referred to as memory devices.

Here, the circuit board 101 which is a printed circuit board may extend to a second direction D2, perpendicular to a first direction D1, between a first edge portion 103 and a second edge portion 105.

The buffer device 110b may receive a command CMD, an address ADDR and the clock signal CLK from the memory controller 30 and re-distribute the received signals to the memory devices.

In response to the re-distributed signals, data received through a data signal DQ and a data strobe signal DQS is written in the memory devices or data stored in the memory devices is outputted through the data signal DQ and the data strobe signal DQS. For example, the buffer device 110b may transmit the address ADDR, the command CMD, and the clock signal CLK from the memory controller 30 to the memory devices.

For example, the memory devices may include a volatile memory device such as a DRAM, an SRAM, and an SDRAM. The memory devices may include a double data rate 5 (DDR5) SDRAM.

The SPD chip 120b may be a programmable read only memory (e.g., EEPROM). The SPD chip 120b may include initial information or device information DI of the memory module 100b. In example embodiments, the SPD chip 120b may include the initial information or the device information DI such as a module form, a module configuration, a storage capacity, a module type, an execution environment, and the like of the memory module 100b.

When the memory system 20 including the memory module 100b is booted up, the memory controller 30 may read the device information DI from the SPD chip 120b and may recognize the memory module 100b based on the device information DI. The memory controller 30 may control the memory module 100b based on the device information DI from the SPD chip 120b. For example, the memory controller 30 may recognize a type of the memory devices included in the memory module 100b based on the device information DI from the SPD chip 120b.

The PMIC 180b receives an input voltage VIN, generates a power supply voltage VDD based on the input voltage VIN and provides the power supply voltage VDD to the memory devices. The memory devices operate based on the power supply voltage VDD.

The buffer device 110b may be disposed on a center of the circuit board 101. The first data memories 203a~203d may be arranged between the buffer device 110b and the first edge portion 103 and the second data memories 204a~204d may be arranged between the buffer device 110 and the second edge portion 105. The ECC memory 200c may be disposed on a center portion of the circuit board 101 and may be adjacent to the buffer device 110b.

Each of the first data memories 203a~203d and each of the second data memories 204a~204d may have substantially the same configuration as a configuration of the data memory 201a of FIG. 6.

Each of the first data memories 203a~203d may be coupled to a corresponding one of the data buffers 161~164 through a data transmission line for receiving/transmitting the data signal DQ and the data strobe signal DQS. Each of the second data memories 204a~204d may be coupled to a corresponding one of the data buffers 165~168 through a data transmission line for receiving/transmitting the data signal DQ and the data strobe signal DQS. The ECC memory may be coupled to the data buffer 170 for receiving/transmitting the parity data set SPRT.

The buffer device 110b may provide a command/address signal to the first data memories 203a~203d through a command/address transmission line 135 and may provide a command/address signal to the second data memories 204a~204d and the ECC memory 200tc through a command/address transmission line 137.

The SPD chip 120b is disposed to be adjacent to the buffer device 110b and the PMIC 180b may be disposed between the data memory 204d and the second edge portion 105.

The ECC memory 200tc may include a first parity region and a second parity region and the buffer device 110b applies a pseudo channel selection signal PCSS to the ECC memory 200tc to activate at least one of the first parity region and the second parity region and to store parity data in activated parity region.

The first parity region may store first sub parity data associated with a first sub user data set which is stored in the first data memories 203a~203d and the second parity region may store second sub parity data associated with a second sub user data set which is stored in the second data memories 204a~204d.

Figure 14B:
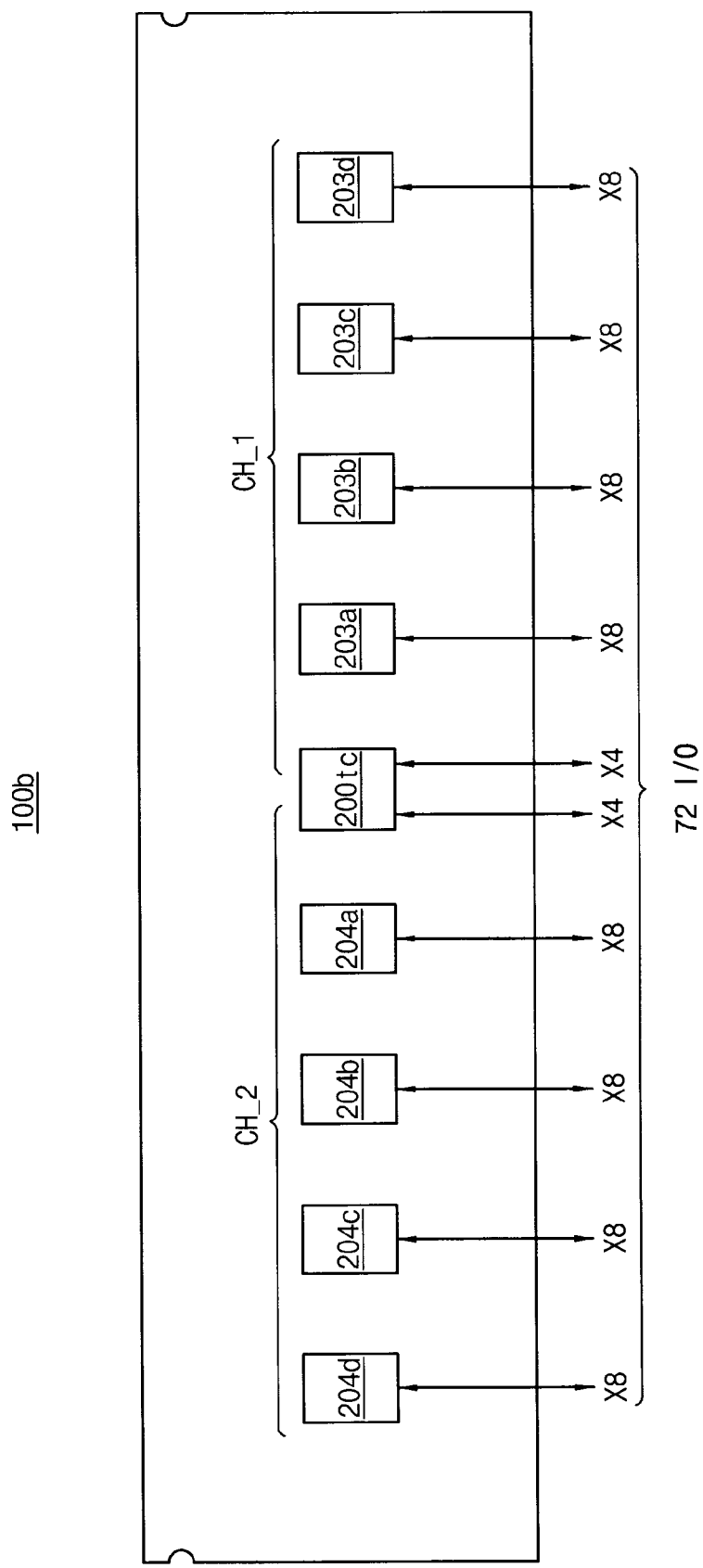
FIG. 14B illustrates a data I/O width of the memory module of FIG. 14A.

FIG. 14B illustrates data I/O width of the memory module of FIG. 14A.

Referring to FIG. 14B, each of the first data memories 203a~203d and the second data memories 204a~204d has an 8-bit data I/O width. The ECC memory 200tc has an 8-bit data I/O width so that 8-bit parity bits per a read or write operation are transmitted via the 8-bit data I/O width. Therefore, the memory module 100b may have a 72-bit data I/O width. The first data memories 203a~203d and a portion of the ECC memory 100tc may constitute a first channel CH_1 of the memory module 100b and the second data memories 204a~204d and a portion of the ECC memory 100tc may constitute a second channel CH_1 of the memory module 100b. The first channel CH_1 and the second channel CH_2 operate independently from each other in inputting/outputting data. That is, the data input/output of the first channel CH1 is not affected by the second channel CH_2 and the data input/output of the second channel CH2 is not affected by the first channel CH_1.

Figure 15:
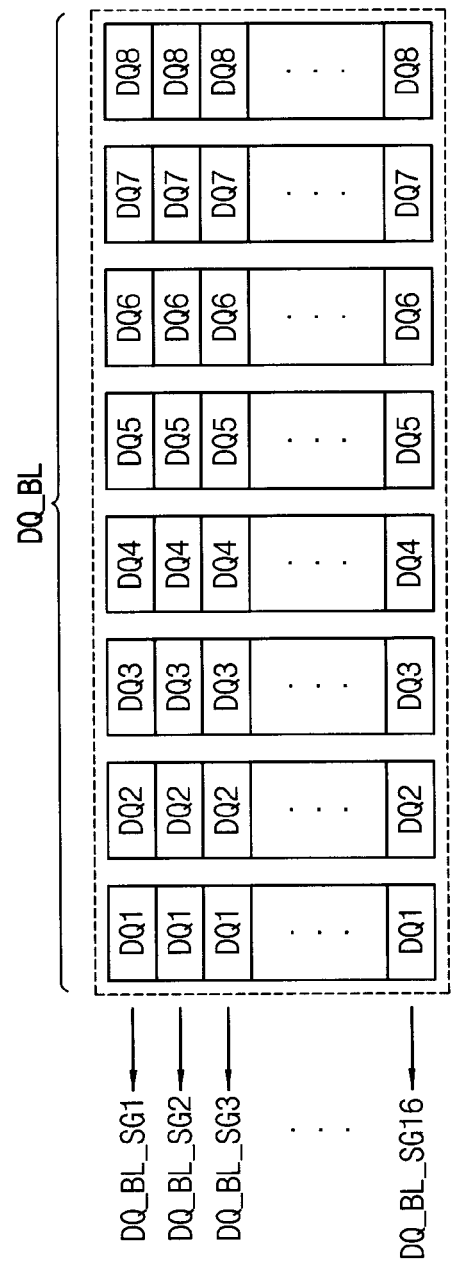
FIG. 15 illustrates a data set corresponding to a burst length in the memory module of FIG. 14 according to example embodiments.

FIG. 15 illustrates a data set corresponding to a burst length in the memory module of FIG. 14 according to example embodiments.

Referring to FIG. 15, the data set DQ_BL corresponding to the burst length is input to/output from each of the first data memories 203a~203d and the second data memories 204a~204d. In an exemplary embodiment, the burst length may be 16. For example, the data set DQ_BL includes sixteen data segments DQ_BL_SG1~DQ_BL_SG16 of which each corresponding one of a plurality of data transfers performed in the burst operation with the burst length of 16. The burst length is assumed to be 16 in FIG. 15, but exemplary embodiments are not limited thereto. The data set DQ_BL corresponding to the burst length may be stored in a first memory region of each of the first data memories 203a~203d and the second data memories 204a~204d.

Figure 16A:
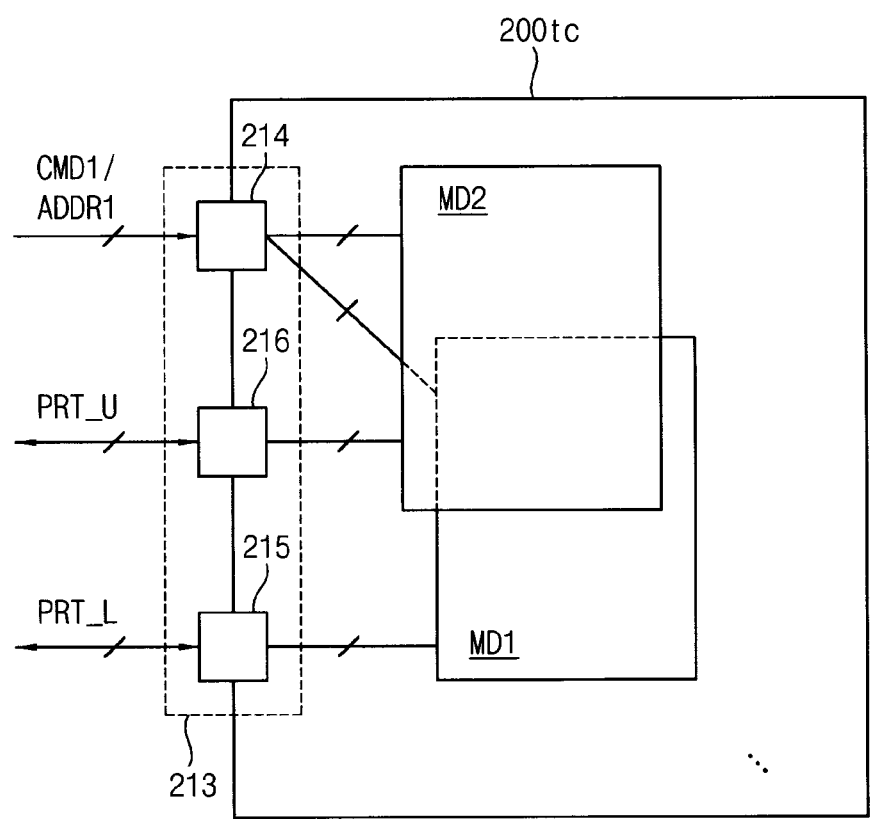
FIG. 16A illustrates an example of an ECC memory in the memory module of FIG. 14A according to example embodiments.

FIG. 16A illustrates an example of the ECC memory in the memory module of FIG. 14A according to example embodiments.

Referring to FIG. 16A, the ECC memory 200tc includes a chip input-output pad unit 213 and a plurality of memory dies MD1 and MD2.

The chip input-output pad unit 213 includes a chip command-address pad unit 214, a lower chip data pad unit 215 and an upper chip data pad unit 216 that are to be connected to an external device. Each of the chip command-address pad unit 214, the lower chip data pad unit 215 and the upper chip data pad unit 216 may include a plurality of pads. For example, the chip command-address pad unit 214 may include a plurality of pads for receiving a command CMD1 and an address ADDR1 from the external device such as the buffer device 110b, the lower chip data pad unit 215 may include a plurality of pads for exchanging first sub parity data PRT_L with the memory controller, and the upper chip data pad unit 216 may include a plurality of pads for exchanging second sub parity data PRT U with the memory controller 30.

The first memory die MD1 may be electrically connected to the chip command-address pad unit 214 and the lower chip data pad unit 215 and electrically disconnected from the upper chip data pad unit 216. The second memory die MD2 may be electrically connected to the chip command-address pad unit 214 and the upper chip data pad unit 216 and electrically disconnected from the lower chip data pad unit 215.

The first memory die MD1 may include a plurality of first bank arrays constituting a first sub channel and a plurality of second bank arrays constituting a second sub channel. The first bank arrays correspond to a first parity region and the second bank arrays correspond to a second parity region. The second memory die MD2 may include a plurality of third bank arrays constituting a first sub channel and a plurality of fourth bank arrays constituting a second sub channel. The third bank arrays correspond to a first parity region and the fourth bank arrays correspond to a second parity region.

Figure 16B:
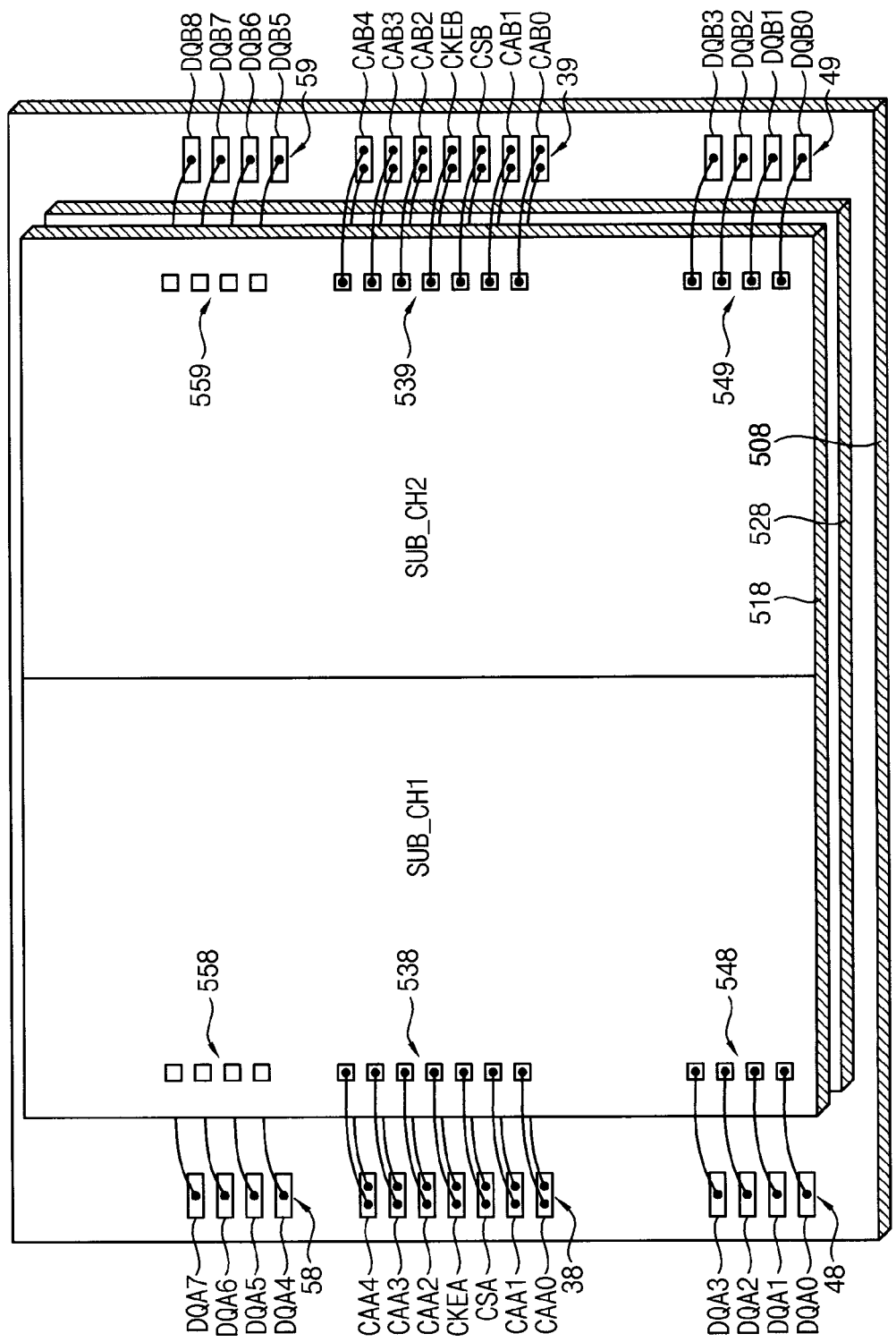
FIG. 16B is a perspective view of the ECC memory of FIG. 16A according to example embodiments.

FIG. 16B is a perspective view of the ECC memory of FIG. 16A according to example embodiments.

Referring to FIG. 16B, the ECC memory 200tc includes a base substrate 508, a first memory die 518 and a second memory die 528. The first memory die 518 and the second memory die 528 are stacked on the base substrate 508.

The base substrate 508 may include a first chip input-output pad unit corresponding to a first sub channel region SUB_CH1 and a second input-output pad unit corresponding to a second sub channel region SUB_CH2. The first chip input-output pad unit may include a first chip command-address pad unit 38, a first lower chip data pad unit 48 and a first upper chip data pad unit 58 that are to be connected to an external device. The second chip input-output pad unit may include a second chip command-address pad unit 39, a second lower chip data pad unit 49 and a second upper chip data pad unit 59 that are to be connected to the external device.

In an embodiment, the first chip command-address pad unit 38 includes a plurality of pads for receiving a first chip selection signal CSA, a first clock enable signal CKEA and first command-address signals CAA0~CAA4. In an embodiment, the first lower chip data pad unit 48 includes four pads for communicating lower data DQA0~DQA3 of four bits and the first upper chip data pad unit 58 includes four pads for communicating upper data DQA4~DQA7 of four bits.

In an embodiment, the second chip command-address pad unit 39 includes a plurality of pads for receiving a second chip selection signal CSB, a second clock enable signal CKEB and second command-address signals CAB0~CAB4. In an embodiment, the second lower chip data pad unit 49 includes four pads for communicating lower data DQB0~DQB3 of four bits and the second upper chip data pad unit 59 includes four pads for communicating upper data DQB4~DQB7 of four bits.

In an embodiment, each of the first memory die 518 and the second memory die 528 include the first sub channel region SUB_CH1 and the second sub channel region SUB_CH2 that are operated independently of each other in inputting/outputting data. That is, the data input/output of the first sub channel SUB_CH1 is not affected by the second sub channel SUB_CH2 and the data input/output of the second sub channel SUB_CH2 is not affected by the first sub channel SUB_CH1.

The first memory die 518 includes first die input-output pad units corresponding to the first sub channel region SUB_CH1 and second die input-output pad units corresponding to the second sub channel region SUB_CH2. The first die input-output pad units include a first die command-address pad unit 538 corresponding to the first chip command-address pad unit 38, a first lower die data pad unit 548 corresponding to the first lower chip data pad unit 48 and a first upper die data pad unit 558 corresponding to the first upper chip data pad unit 58. The second die input-output pad units include a second die command-address pad unit 539 corresponding to the second chip command-address pad unit 39, a second lower die data pad unit 549 corresponding to the second lower chip data pad unit 49 and a second upper die data pad unit 559 corresponding to the second upper chip data pad unit 59. Even though not illustrated in FIG. 16B, the second memory die 528 may include a first die input-output pad unit corresponding to the first sub channel region SUB_CH1 and a second die input-output pad unit corresponding to the second sub channel region SUB_CH2 of the same configuration as the first memory die 518.

The first die command-address pad unit 538 and the second die command-address pad unit 539 of the first memory die 518 and the die command-address pad units (not shown) of the second memory die 528 may be commonly connected to the first chip command-address pad unit 38 and the second chip command-address pad unit 39, respectively. The first lower die data pad unit 548 and the second lower die data pad unit 549 of the first memory die 518 may be electrically connected to the first lower chip data pad unit 48 and the second lower chip data pad unit 49, respectively. The first upper die data pad unit 558 and the second upper die data pad unit 559 of the first memory die 518 may be electrically disconnected from the first upper chip data pad unit 58 and the second upper chip data pad unit 59, respectively. The upper die data pad units (not shown) of the second memory die 528 may be electrically connected to the first upper chip data pad unit 58 and the second upper chip data pad unit 59 and the lower die data pad units (not shown) of the second memory die 528 may be electrically disconnected from the first lower chip data pad unit 48 and the second lower chip data pad unit 49.

As illustrated in FIG. 16B, the first memory die 518 and the second memory die 528 may be connected to the first lower chip data pad unit 48 and the second lower chip data pad unit 49, and the first upper chip data pad unit 58 and the second upper chip data pad unit 59 through bonding wires, respectively. In addition, the first memory die 518 and the second memory die 528 may be connected commonly to the first chip command-address pad unit 38 and the second chip command-address pad unit 39 through the bonding wires. In other example embodiments, the first memory die 518 and the second memory die 528 may be connected commonly to the first chip command-address pad unit 38 and the second chip command-address pad unit 39 using through-substrate vias (TSV).

Figure 17:
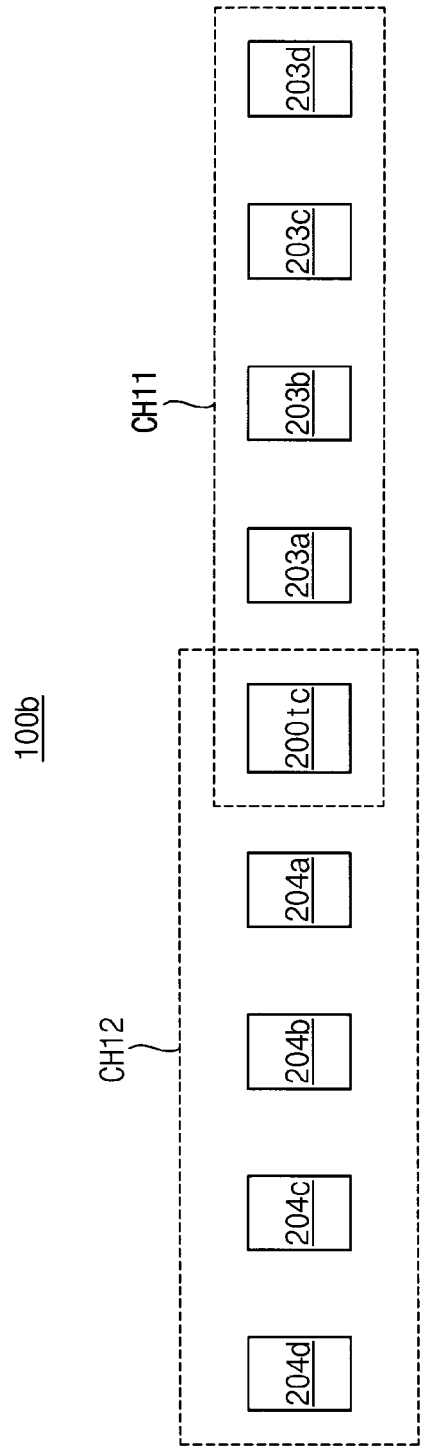
FIG. 17 illustrates an operation of the memory module of FIG. 14A according to example embodiments.

FIG. 17 illustrates an operation of the memory module of FIG. 14A according to example embodiments.

Referring to FIG. 17, the first data memories 203a~203d and the ECC memory 200tc may constitute a first channel CH11 and the second data memories 204a~204d and the ECC memory 200tc may constitute a second channel CH12. The first channel CH11 and the second channel CH12 operate independently from each other in inputting/outputting data. That is, the data input/output of the first channel CH11 is not affected by the second channel CH12 and the data input/output of the second channel CH12 is not affected by the first channel SUB_CH11. During an operation of the first channel CH11, the ECC memory 200tc may store the first sub parity data, associated with the first sub user data stored in the first data memories 203a~203d, in the first and second parity regions. During an operation of the second channel CH12, the ECC memory 200tc may store the second sub parity data, associated with the second sub user data stored in the first data memories 204a~204d, in the first and second parity regions. The buffer device 110b applies the pseudo channel selection signal PCSS to the ECC memory 200tc to activate the first parity region and the second parity region.

Figure 18:
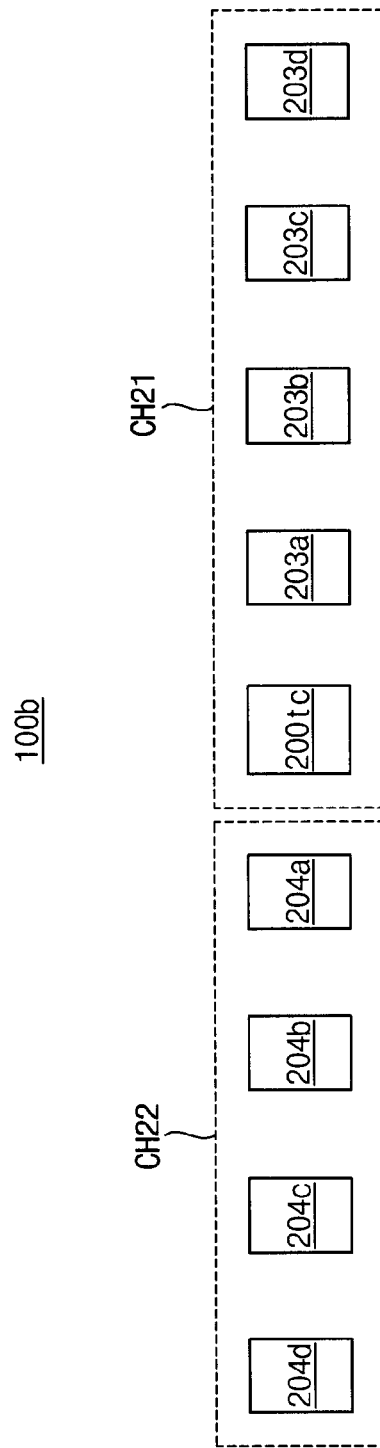
FIG. 18 illustrates an operation of the memory module of FIG. 14A according to example embodiments.

FIG. 18 illustrates an operation of the memory module of FIG. 14A according to example embodiments.

Referring to FIG. 18, the first data memories 203a~203d and the ECC memory 200tc may constitute a first channel CH21 and the second data memories 204a~204d may constitute a second channel CH22. The first channel CH21 and the second channel CH22 operate independently from each other in inputting/outputting data. That is, the data input/output of the first channel CH21 is not affected by the second channel CH22 and the data input/output of the second channel CH22 is not affected by the first channel SUB_CH21. During an operation of the first channel CH21, the ECC memory 200tc may store the first sub parity data, associated with the first sub user data stored in the first data memories 203a~203d, in the first and second parity regions. The buffer device 110b applies the pseudo channel selection signal PCSS to the ECC memory 200tc to activate the first parity region and the second parity region.

During an operation of the second channel CH22, the buffer device 110b applies the pseudo channel selection signal PCSS to the ECC memory 200tc to deactivate the first parity region and the second parity region.

The example of FIG. 18 assumes that a credibility of the first sub user data set has a priority over a credibility of the second sub user data set.

Figure 19:
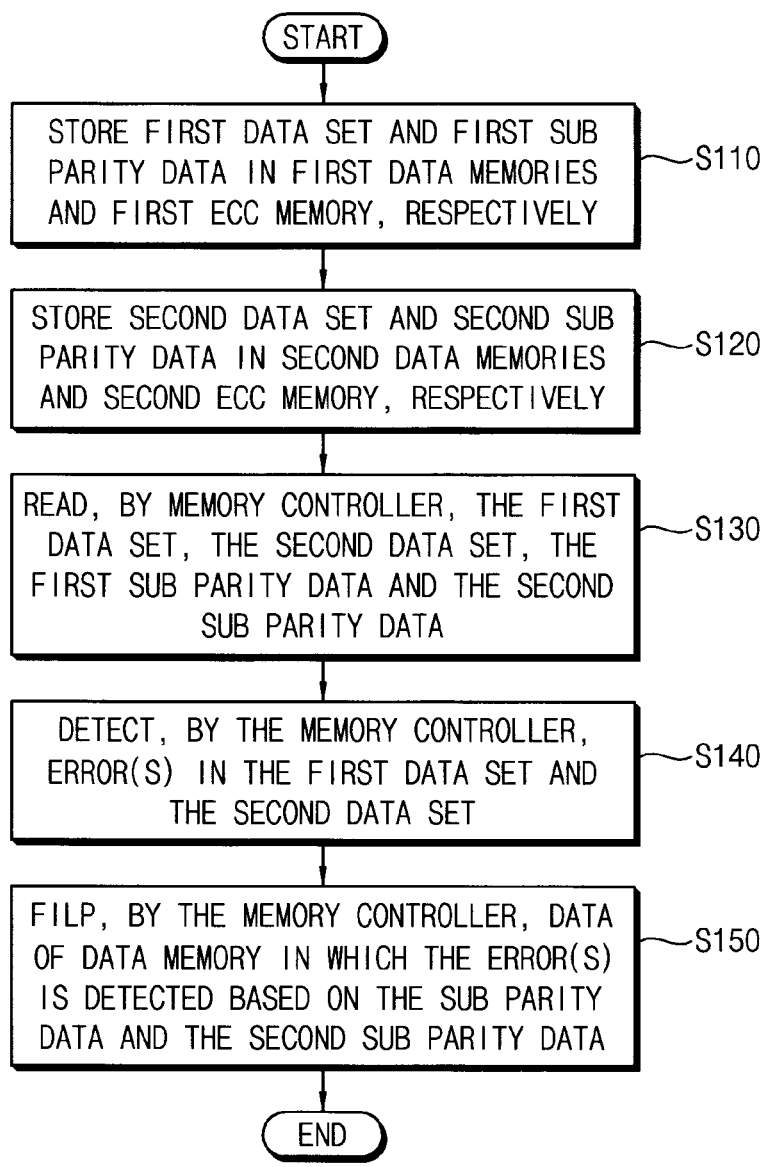
FIG. 19 is a flow chart illustrating a method of operating a memory system according to example embodiments.

FIG. 19 is a flow chart illustrating a method of operating a memory system according to example embodiments.

Referring to FIGS. 1 through 13 and 19, a method of operating a memory module 100a and a memory controller 30 to control the memory module 100a is provided. The memory module 100a includes a plurality of first data memories 201a~201h, a first ECC memory 200ta, a plurality of second data memories 202a~202h and a second ECC memory 200tb. In the method, the memory controller 30 stores each of a plurality of first data sets in a corresponding one of the first data memories 201a~201h and stores, in the first ECC memory 200ta, first sub parity data associated with all of the plurality of first data sets (S110). The memory controller 30 stores each of a plurality of second data sets in a corresponding one of the second data memories 202a~202h and stores, in the second ECC memory 200tb, second sub parity data associated with all of the plurality of second data sets (S120).

The memory controller 30 reads the first data sets, the second data sets, the first sub parity data and the second sub parity data from the memory module 100a (S130). The memory controller 30 detects at least one error bit in the first data sets and the second data sets based on the first sub parity data and the second sub parity data (S140). The memory controller 30 determines whether the detected error bit is uncorrectable based on the first sub parity data and the second sub parity data and flips a value of the detected error bit of a data memory in response to the determination of the detected error being uncorrectable (S150).

That is, when a first data set of the first data sets includes one error, the memory controller 30 corrects the error. When the first data set includes two or more errors, the memory controller flips a value of the uncorrectable data bit of a data memory generating the detected error because the memory controller 30 cannot correct the two or more errors.

Figure 20:
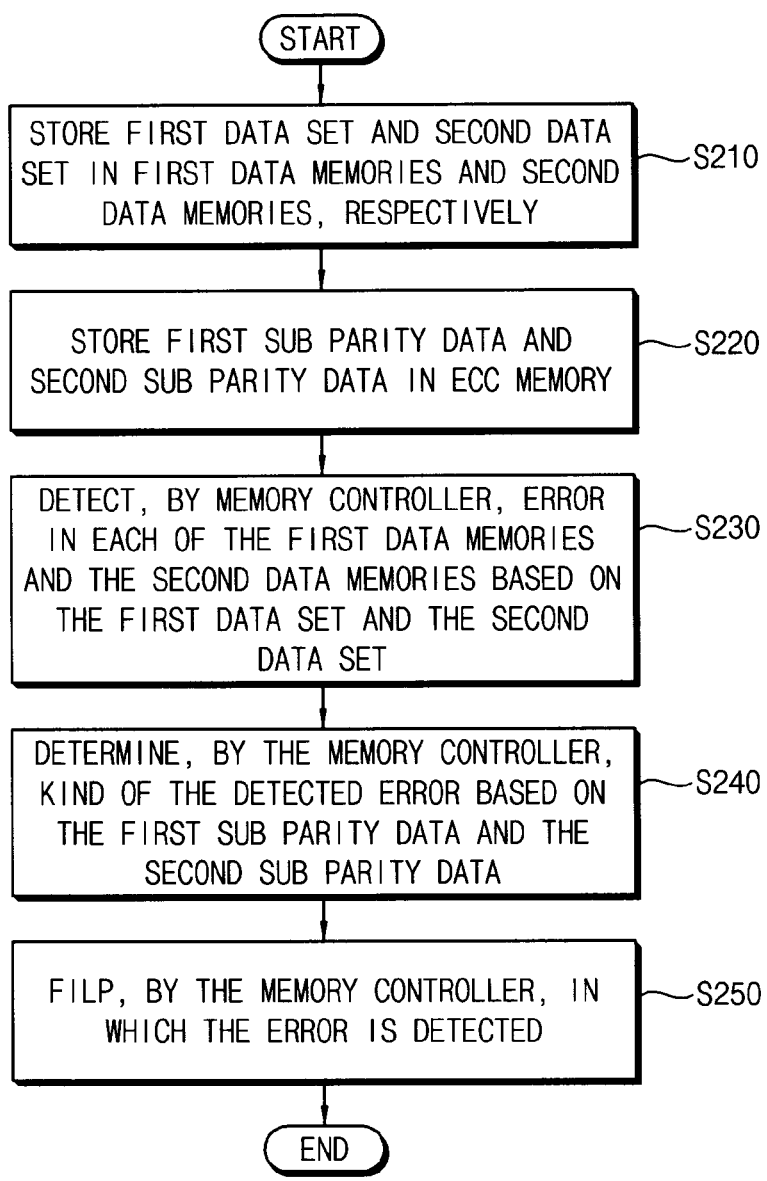
FIG. 20 is a flow chart illustrating a method of operating a memory system according to example embodiments.

FIG. 20 is a flow chart illustrating a method of operating a memory system according to example embodiments.

Referring to FIGS. 1, 14A, 18 and 20, a method of operating a memory module 100b and a memory controller 30 to control the memory module 100b is provided. The memory module 100b includes a plurality of first data memories 203a~203d, a plurality of second data memories 204a~204d, and an ECC memory 200tc. In the method, the memory controller 30 stores each of a plurality of first data sets in a corresponding one of the first data memories 203a~203d and stores each of a plurality of second data sets in a corresponding one of the second data memories 204a~204d (S210). The memory controller 30 stores, in the ECC memory 200tc, first sub parity data associated with all of the first data sets and second sub parity data associated with all of the second data sets (S220). The first sub parity data and the second sub parity data may be stored in a first parity region and a second parity region in the ECC memory 200tc, respectively. The present invention is not limited thereto. For example, the first sub parity data and the second sub parity data may be stored in the first parity region or may be stored in the second parity region.

The memory controller 30 reads the first data sets, the second data sets, the first sub parity data and the second sub parity data and detects whether each of the first data memories 203a~203d and the second data memory 204a~204d has an error bit (S230). The memory controller 30 determines whether the detected error bit is uncorrectable based on the first sub parity data and the second sub parity data (S240). The memory controller 30 flips a value of the detected error bit of a data memory in response to the determination of the detected error being uncorrectable (S250).

That is, when the first data set and the second data set includes one error, the memory controller 30 corrects the error. When the first data set and the second data set includes two or more errors, the memory controller flips data bits of a data memory generating the detected error because the memory controller 30 cannot correct the two or more errors.

Figure 21:
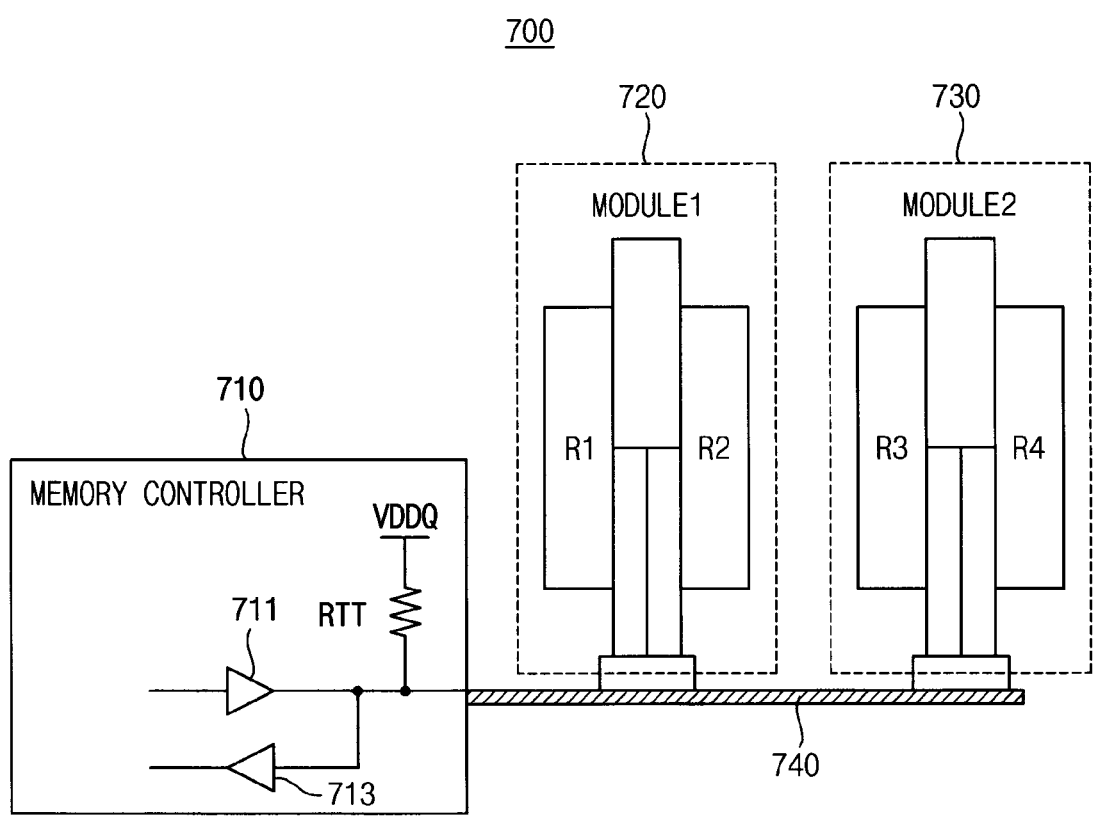
FIG. 21 is a block diagram illustrating a memory system having quad-rank memory modules according to example embodiments.

FIG. 21 is a block diagram illustrating a memory system having quad-rank memory modules according to example embodiments.

Referring to FIG. 21, a memory system 700 may include a memory controller 710 and at least one or more memory modules including a first memory module 720 and a second memory module 730.

The memory controller 710 may control a memory module according to a command supplied from a processor or host. The memory controller 710 may be implemented in a processor or host or may be implemented with an application processor or a system-on-a-chip (SOC). For signal integrity, a source termination may be implemented with a resistor RTT on a data bus 740 of the memory controller 710. The resistor RTT may be coupled to a power supply voltage VDDQ. The memory controller 710 may include a transmitter 711 to transmit signal to the at least one or more memory modules and a receiver 713 to receive signal from the at least one or more memory modules.

The first memory module 720 and the second memory module 730 may be coupled to the memory controller 710 through the data bus 740. Each of the first memory module 720 and the second memory modules 730 may be the memory module 100a of FIG. 2A or the memory module 100b of FIG. 14A. The first memory module 720 includes two memory ranks R1 and R2, and the second memory module 730 includes two memory ranks R3 and R4.

Each of the first memory module 720 and the second memory module 730 may include first data memories, a second data memories and at least one ECC memory providing a 72-bit data I/O width and may perform an on-chip error detection and correction operation.

Figure 22:
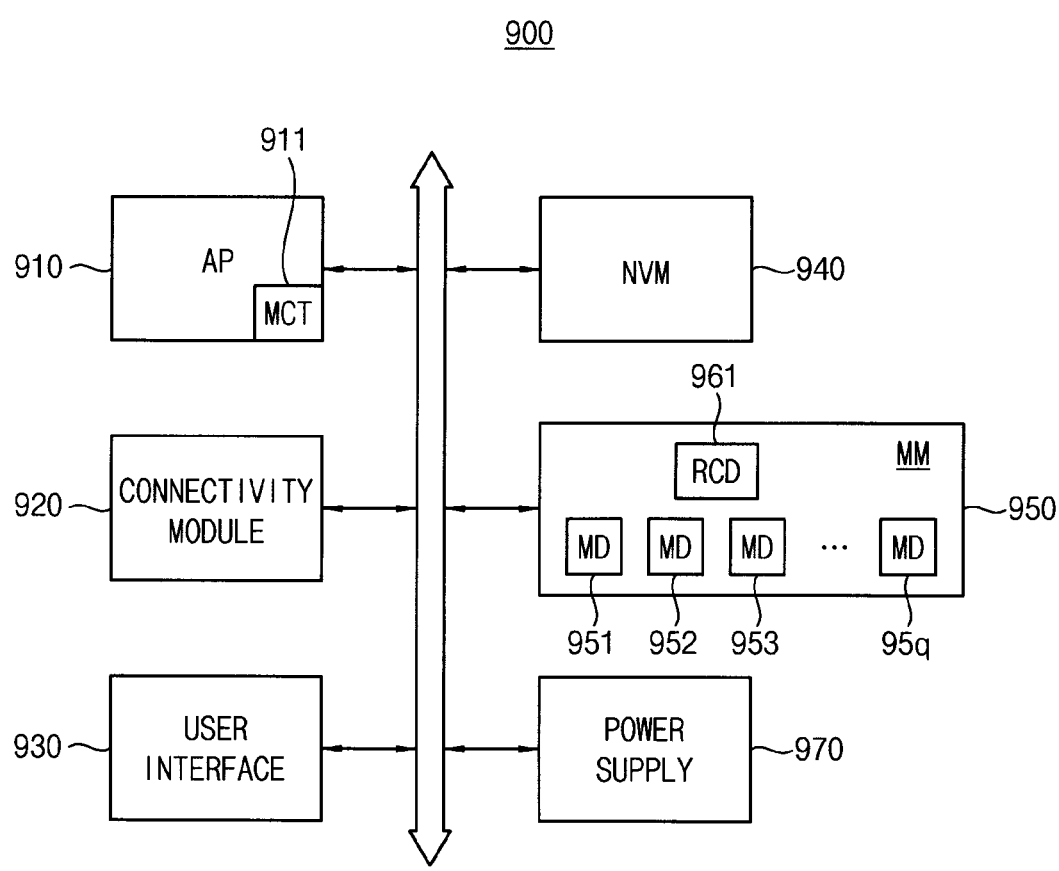
FIG. 22 is a block diagram illustrating a mobile system including a memory module according to example embodiments.

FIG. 22 is a block diagram illustrating a mobile system including the memory module according to example embodiments.

Referring to FIG. 22, a mobile system 900 may include an application processor 910, a connectivity module 920, a memory module 950, a nonvolatile memory device 940, a user interface 930 and a power supply 970. The application processor 910 may include a memory controller 911.

The application processor 910 may execute applications, such as a web browser, a game application, a video player software, etc. The connectivity module 920 may perform wired or wireless communication with an external device.

The memory module 950 may store data processed by the application processor 910 or operate as a working memory. The memory module 950 may include a plurality of semiconductor memory devices (MD) 951~95q (q is a natural number greater than three), and a buffer device 961. The semiconductor memory devices 951~95q may include first data memories, a second data memories and at least one ECC memory providing a 72-bit data I/O width and may perform an on-chip error detection and correction operation.

The nonvolatile memory device 940 may store a boot image for booting the mobile system 900. The user interface 930 may include at least one input device, such as a keypad, a touch screen, etc., and at least one output device, such as a speaker, a display device, etc. The power supply 960 may supply an operating voltage to the mobile system 900.

In some embodiments, the mobile system 900 and/or components of the mobile system 900 may be packaged in various forms.

The present disclosure may be applied to memory modules and memory systems that employ an ECC memory.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A memory module comprising:
a plurality of first data memories and a first error correction code (ECC) memory that constitute a first channel; and
a plurality of second data memories and a second ECC memory that constitute a second channel,
wherein each of the plurality of first data memories is configured to transmit a corresponding first data set of a plurality of first data sets with a memory controller, each of the plurality of first data sets corresponding to a burst length,
each of the plurality of second data memories is configured to transmit a corresponding second data set of a plurality of second data sets with the memory controller, each of the plurality of second data sets corresponding to the burst length,
the first ECC memory is configured to store first sub parity data for detecting at least one error in all of the plurality of first data sets stored in the plurality of first data memories, and
the second ECC memory is configured to store second sub parity data for detecting at least one error in all of the plurality of second data sets stored in the plurality of second data memories,
wherein:
the first ECC memory includes a first parity region and a second parity region;
the first parity region stores the first sub parity data; and
the second parity region stores first internal parity bits generated based on the first sub parity data.

2. The memory module of claim 1, wherein:
each of the plurality of first data memories has a 4-bit data input/output (I/O) width;
each of the plurality of second data memories has a 4-bit data IO width; and
each of the first ECC memory and the second ECC memory stores has a 4-bit data I/O width.

3. The memory module of claim 2,
wherein each of the first channel and the second channel has a 36-bit data input/output width.

4. The memory module of claim 1, wherein:
each of the plurality of first data memories includes a memory cell array that having a first memory region and a second memory region;
the first memory region of each of the plurality of first data memories stores a corresponding first data set of the plurality of first data sets and the second memory region stores first parity bits generated from an ECC encoding operation performed on the corresponding first data set; and
the first parity bits are part of the first sub parity data.

5. The memory module of claim 4,
wherein each of the plurality of first data memories includes an ECC engine including:
an ECC encoder configured to perform the ECC encoding operation on the corresponding first data set of the plurality of first data sets to generate the first parity bits; and
an ECC decoder configured to perform an ECC decoding operation on a corresponding first data set of the plurality of first data sets read from the first memory region to correct an error detected from the corresponding first data set of the plurality of first data sets which are read from the first memory region.

6. The memory module of claim 1,
wherein the first ECC memory further includes an ECC engine including:
an ECC encoder configured to perform an ECC encoding operation on the first sub parity data to generate the first internal parity bits; and
an ECC decoder configured to perform an ECC decoding operation on the first sub parity data read from the first parity region to correct an error detected in the first sub parity data.

7. The memory module of claim 1, wherein:
the second ECC memory includes a third parity region and a fourth parity region;
the third parity region stores the second sub parity data; and
the fourth parity region stores second internal parity bits generated based on the second sub parity data.

8. The memory module of claim 7,
wherein the second ECC memory further includes an ECC engine including:
an ECC encoder configured to perform an ECC encoding operation on the second sub parity data to generate the second internal parity bits; and an ECC decoder configured to perform an ECC decoding operation on the second sub parity data read from the third parity region to correct an error detected in the second sub parity data.

9. The memory module of claim 1, wherein:
a first error of at least one first data memory of the plurality of first data memories is detected and corrected based on the first sub parity data stored in the first ECC memory; and
a second error of at least one second data memory of the plurality of second data memories is detected and corrected based on the second sub parity data stored in the second ECC memory.

10. A memory module comprising:
a first channel including a plurality of first data memories;
a second channel including a plurality of second data memories; and
an error correction code (ECC) memory,
wherein the plurality of first data memories and the plurality of second data memories store a plurality of first data sets and a plurality of second data sets respectively,
each of the plurality of first data sets corresponds to a burst length,
each of the plurality of second data sets corresponds to the burst length, and
the ECC memory is configured to store parity data for detecting at least one error in at least one of a first sub user data set corresponding to all of the plurality of first data sets and a second sub user data set corresponding to all of the plurality of second data sets,
wherein:
the ECC memory includes a first parity region and a second parity region,
the first parity region stores at least one of first sub parity data associated with the first sub user data set and second sub parity data associated with the second sub user data set, and
the second parity region stores at least one of the first sub parity data and the second sub parity data.

11. The memory module of claim 10, wherein:
each of the plurality of first data memories has an 8-bit data input/output (I/O) width,
each of the plurality of second data memories has an 8-bit data I/O width; and
the ECC memory has an 8-bit data IO width.

12. The memory module of claim 10, further comprising a buffer device,
wherein the buffer device is configured to redistribute a command and an address received from an external memory controller to each of the plurality of first data memories, each of the plurality of second data memories and the ECC memory, and
the buffer device is configured to apply a pseudo channel selection signal to the ECC memory to activate at least one of the first parity region and the second parity region.

13. The memory module of claim 12, wherein:
the first parity region, if activated by the pseudo channel selection signal, stores the first sub parity data during operation of the first channel;
the second parity region, if activated by the pseudo channel selection signal, stores the second sub parity data during operation of the second channel;
the first channel further includes the first parity region; and
the second channel further includes the second parity region.

14. The memory module of claim 12, wherein:
the first parity region and the second parity region, if activated by the pseudo channel selection signal, store the first sub parity data during operation of the first channel;
the first parity region and the second parity region, if activated by the pseudo channel selection signal, store the second sub parity data during operation of the second channel;
each of the first channel and the second channel further includes the first parity region and the second parity region; and
the first parity region and the second parity region are shared by the first channel and the second channel.

15. The memory module of claim 12, wherein:
the first parity region and the second parity region are enabled by the pseudo channel selection signal to store the first sub parity data during operation of the first channel;
the first parity region and the second parity region are disabled during operation of the second channel; and
the first channel further includes the first parity region and the second parity region.

16. The memory module of claim 10,
wherein each of the plurality of first data memories further include an ECC engine including:
an ECC encoder configured to perform an ECC encoding operation on a corresponding first data set of the plurality of first data sets to generate first parity bits; and
an ECC decoder configured to perform an ECC decoding operation on a corresponding first data set of the plurality of first data sets read from the ECC memory to correct an error detected from the corresponding first data set of the plurality of first data sets which are read from the ECC memory.

17. The memory module of claim 10,
wherein the ECC memory is configured to correct an error bit of at least one first data memory of the plurality of first data memories based on the parity data and the error bit is detected in the plurality of first data sets.

18. A method of operating a memory system, wherein the memory system includes a memory module and a memory controller to control the memory module and the memory module includes a plurality of first data memories, a plurality of second data memories and an error correction code (ECC) memory, the method comprising:
storing each of a plurality of first data sets corresponding to a burst length in a corresponding first data memory of the plurality of first data memories;
storing each of a plurality of second data sets corresponding to the burst length in a corresponding second data memory of the plurality of second data memories;
storing, in the ECC memory, first sub parity data associated with all of the plurality of first data sets and second sub parity data associated with all of the plurality of second data sets;
detecting, by the memory controller, whether each of the plurality of first data memories and the plurality of second data memories has an error bit based on all of the plurality of first data sets and all of the plurality of second data sets;
determining, by the memory controller, whether the detected error bit is correctable based on the first sub parity data and the second sub parity data; and flipping, by the memory controller, a data value of the detected error bit in response to determining that the detected error bit is not correctable.

\* \* \* \* \*